(12) United States Patent
Moxham et al.

(10) Patent No.: US 6,913,952 B2
(45) Date of Patent: Jul. 5, 2005

(54) METHODS OF FORMING CIRCUIT TRACES AND CONTACT PADS FOR INTERPOSERS UTILIZED IN SEMICONDUCTOR PACKAGES

(75) Inventors: Stephen F. Moxham, Boise, ID (US); Lee Teck Kheng, Singapore (SG); Steve Thummel, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 97 days.

(21) Appl. No.: 10/612,837

(22) Filed: Jul. 3, 2003

(65) Prior Publication Data

US 2005/0003607 A1 Jan. 6, 2005

(51) Int. Cl.⁷ .......................... H01L 21/48; H05K 3/00; H05K 1/03
(52) U.S. Cl. .................. 438/125; 438/612; 438/614; 438/637; 29/829; 29/846; 29/849; 29/874; 29/884; 174/255; 174/260
(58) Field of Search .................. 438/110, 125, 438/612–614, 637, 638, 652, 669, 674; 257/773, 786; 29/825, 829, 846, 847, 849, 874–879, 884; 174/250, 255, 256, 260

(56) References Cited

U.S. PATENT DOCUMENTS

| | | | |
|---|---|---|---|
| 5,977,641 A | * | 11/1999 | Takahashi et al. .......... 257/778 |
| 6,034,429 A | | 3/2000 | Glenn et al. |
| 6,117,705 A | | 9/2000 | Glenn et al. |
| 6,153,448 A | * | 11/2000 | Takahashi et al. .......... 438/114 |
| 6,197,407 B1 | * | 3/2001 | Andou et al. ............... 428/209 |
| 6,331,453 B1 | * | 12/2001 | Bolken et al. .............. 438/127 |
| 6,344,696 B2 | * | 2/2002 | Nakamura et al. .......... 257/786 |
| 6,369,454 B1 | | 4/2002 | Chung |
| 6,406,934 B1 | | 6/2002 | Glenn et al. |
| 6,437,427 B1 | | 8/2002 | Choi |
| 6,475,827 B1 | | 11/2002 | Lee et al. |
| 6,515,356 B1 | | 2/2003 | Shin et al. |
| 6,552,416 B1 | | 4/2003 | Foster |
| 6,555,416 B2 | * | 4/2003 | Nakamura et al. .......... 438/108 |
| 6,555,899 B1 | | 4/2003 | Chung et al. |
| 6,851,184 B2 | * | 2/2005 | Lee et al. ..................... 29/847 |

* cited by examiner

Primary Examiner—Alonzo Chambliss
(74) Attorney, Agent, or Firm—Wells St. John P.S.

(57) ABSTRACT

The invention encompasses methods of preparing interposers for utilization in semiconductor packages. The invention includes a method in which an interposer substrate having a surface and a conductive layer extending over the surface is provided. Pads are formed on the conductive layer by plating a conductive material on the conductive layer while using the conductive layer as an electrical connection to a power source and without utilizing conductive busses, other than the conductive layer. Subsequent to the formation of the pads, the conductive layer is patterned into circuit traces. Methodology of the present invention can be utilized for, for example, forming board-on-chip constructions.

39 Claims, 16 Drawing Sheets

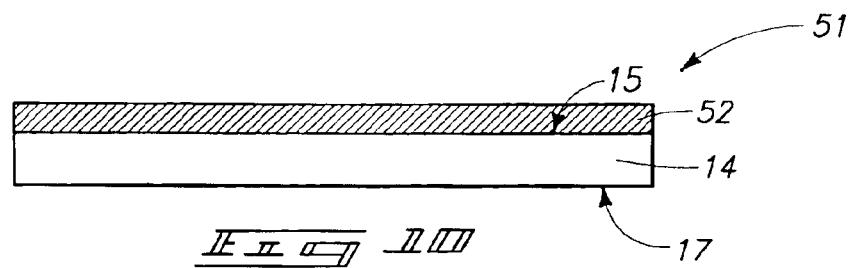
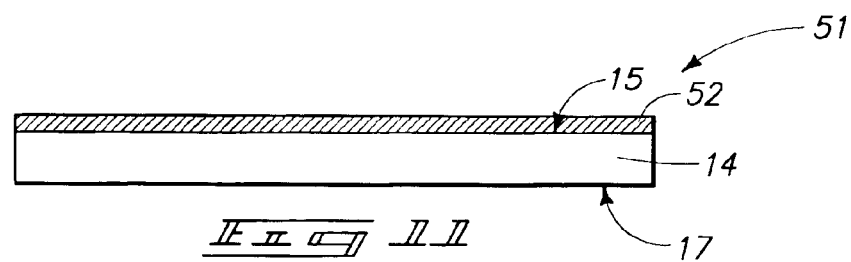
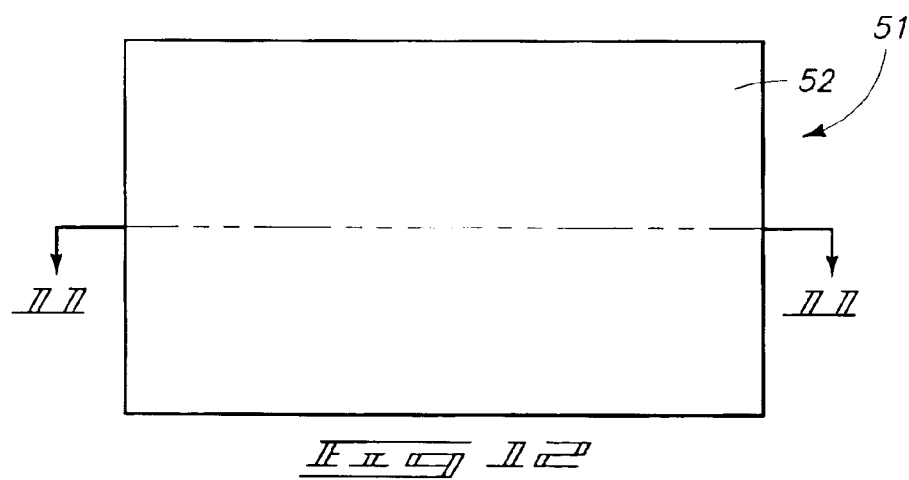
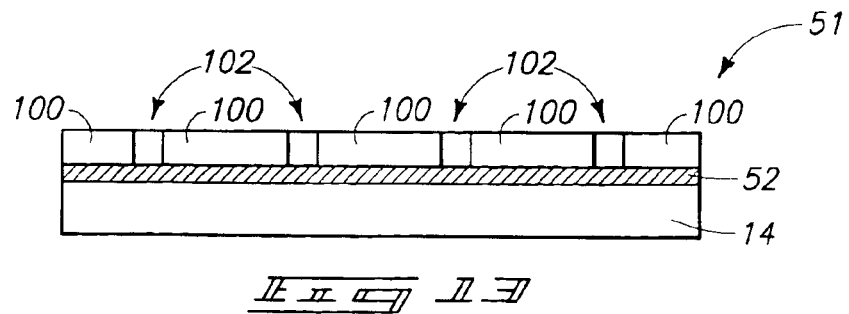

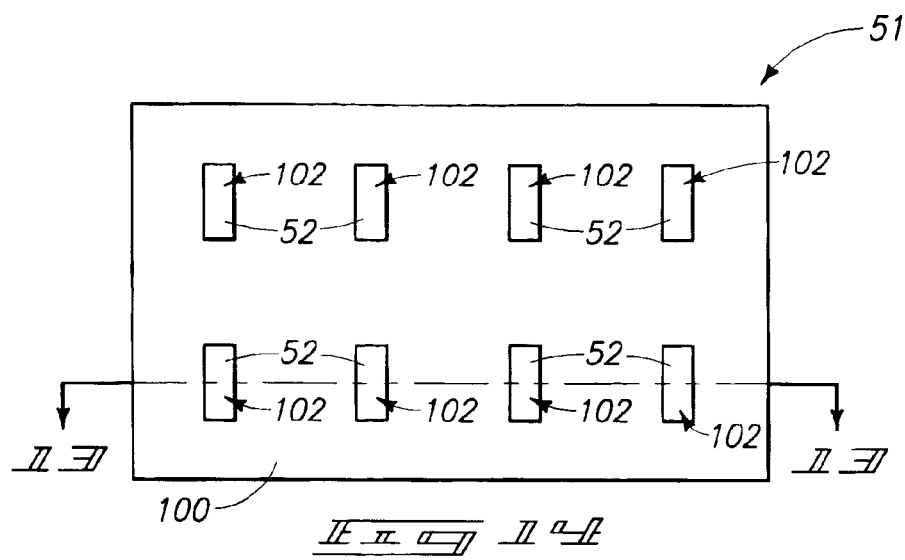
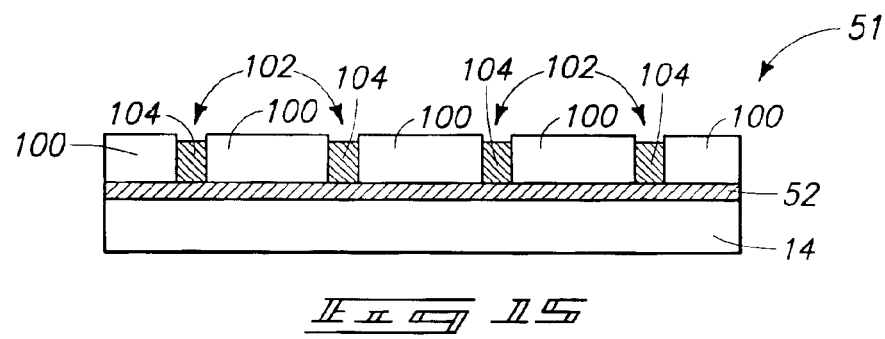
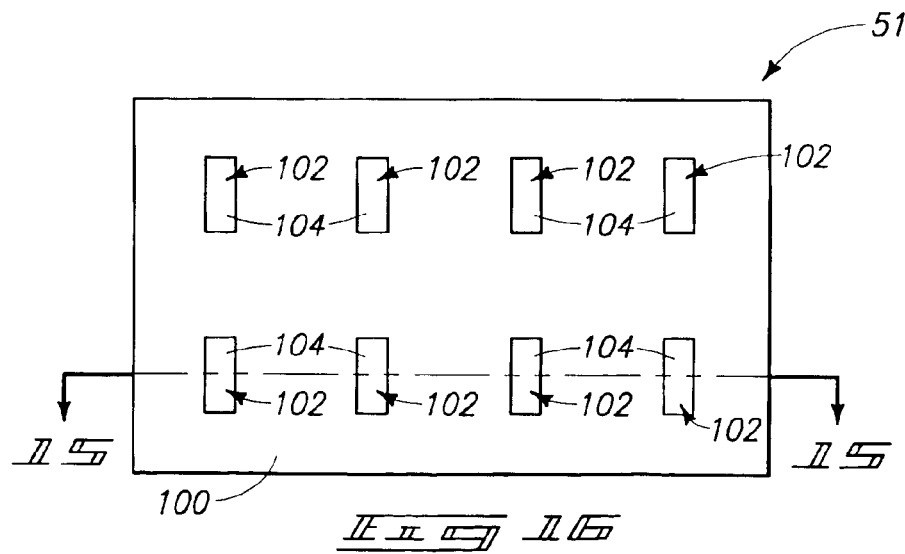

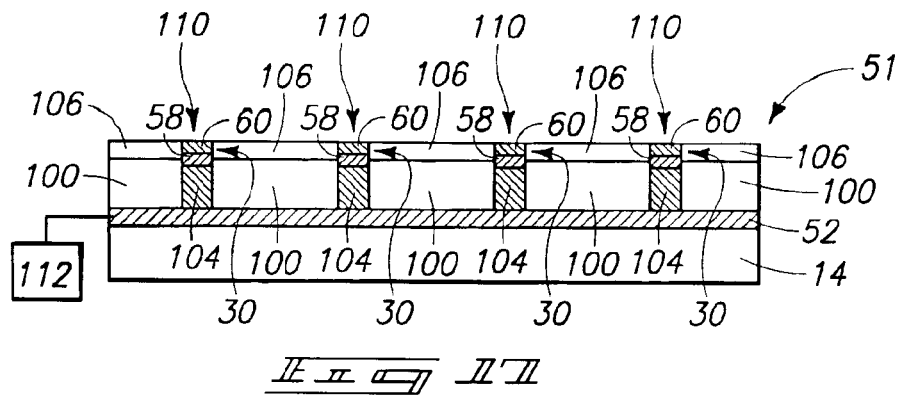
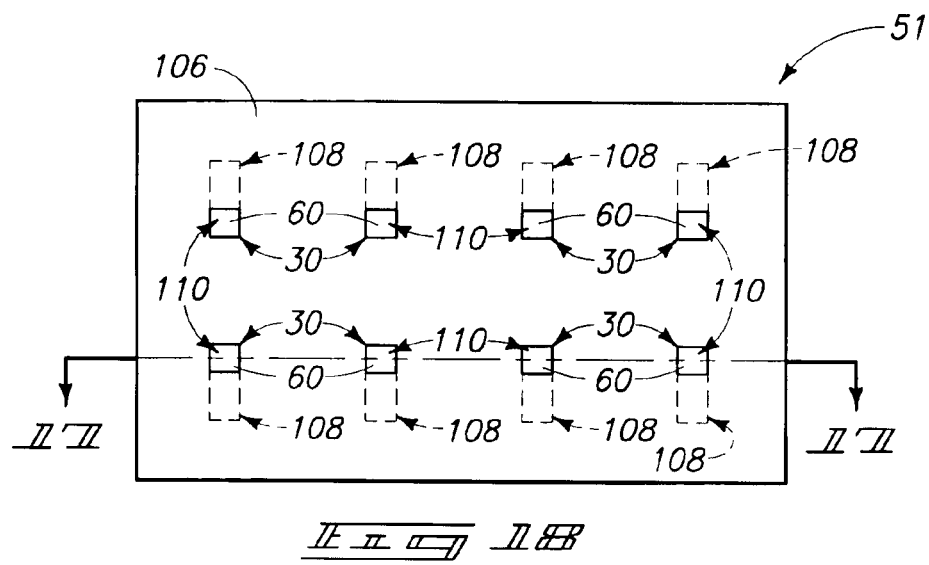
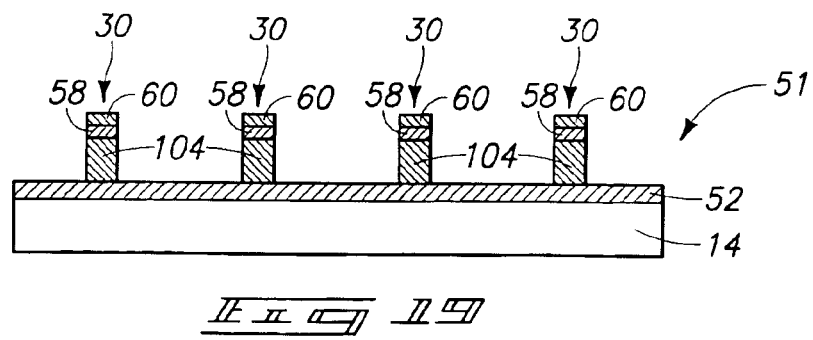

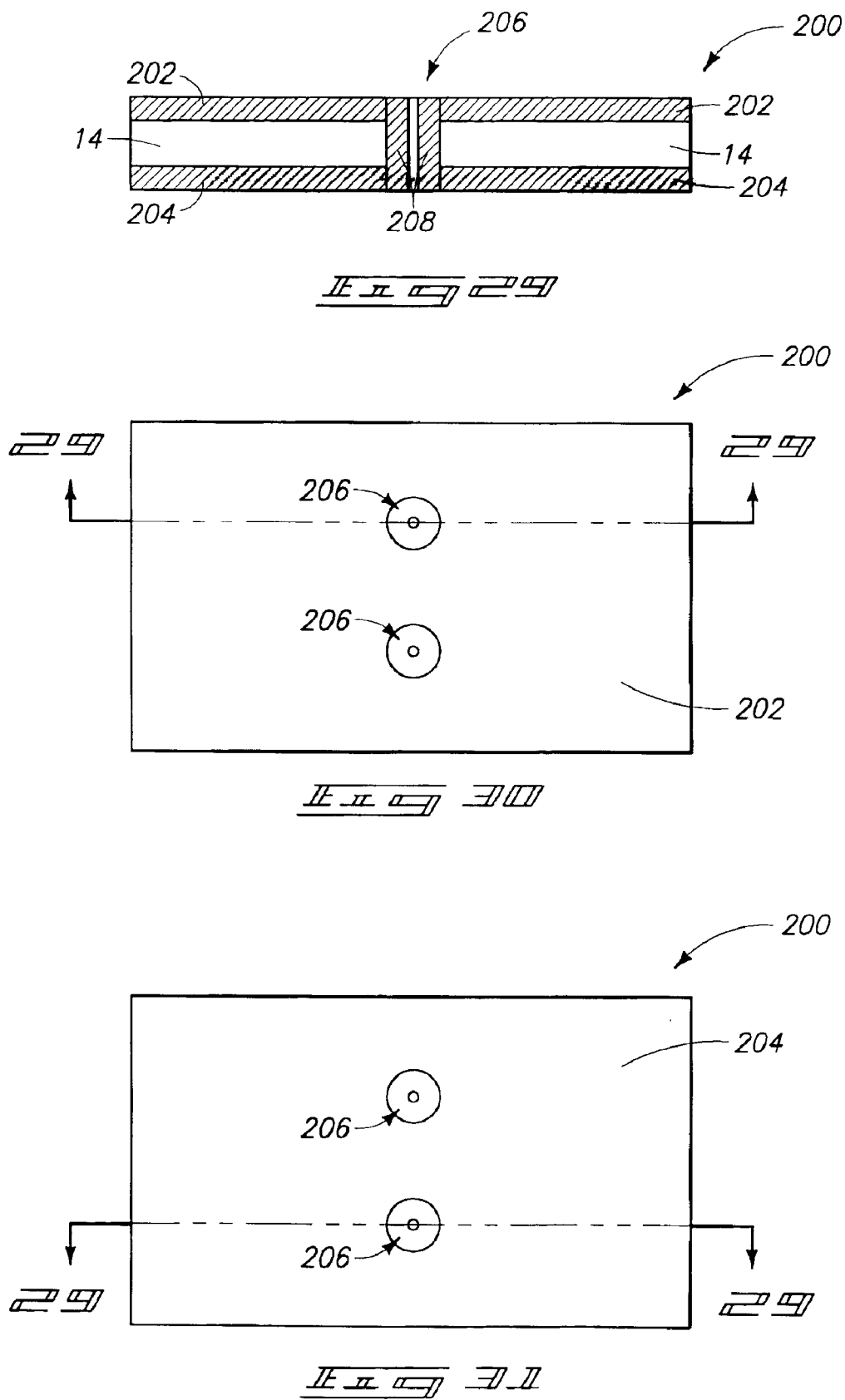

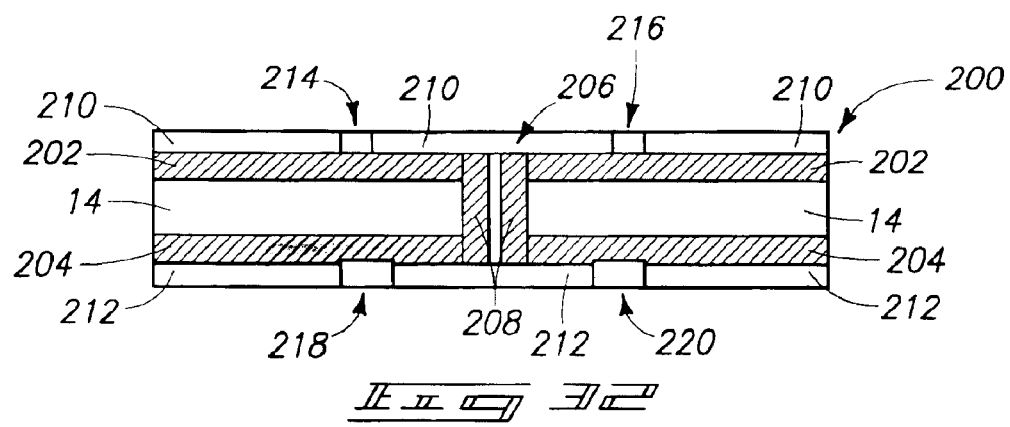
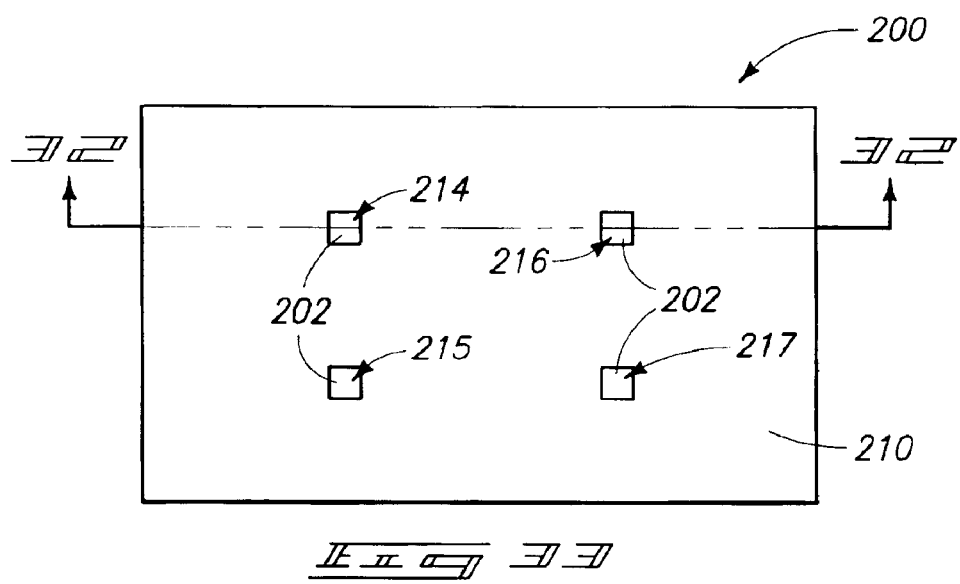
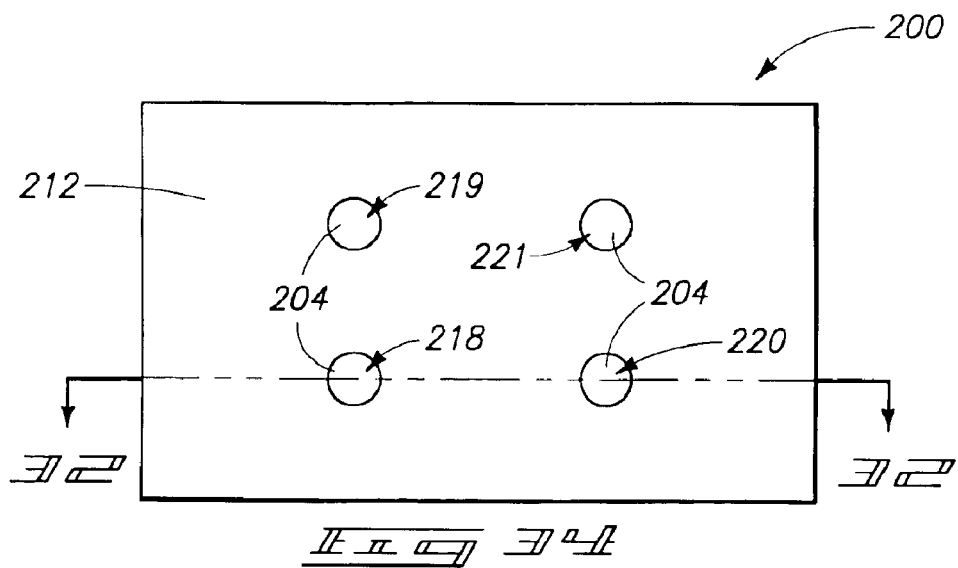

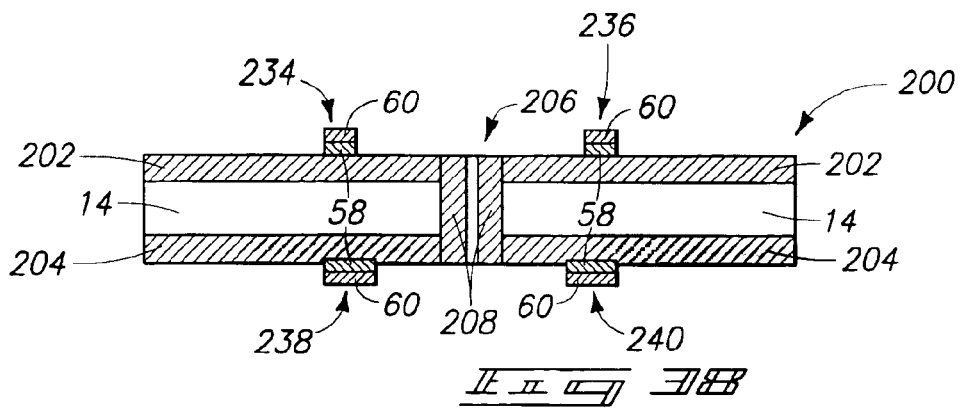
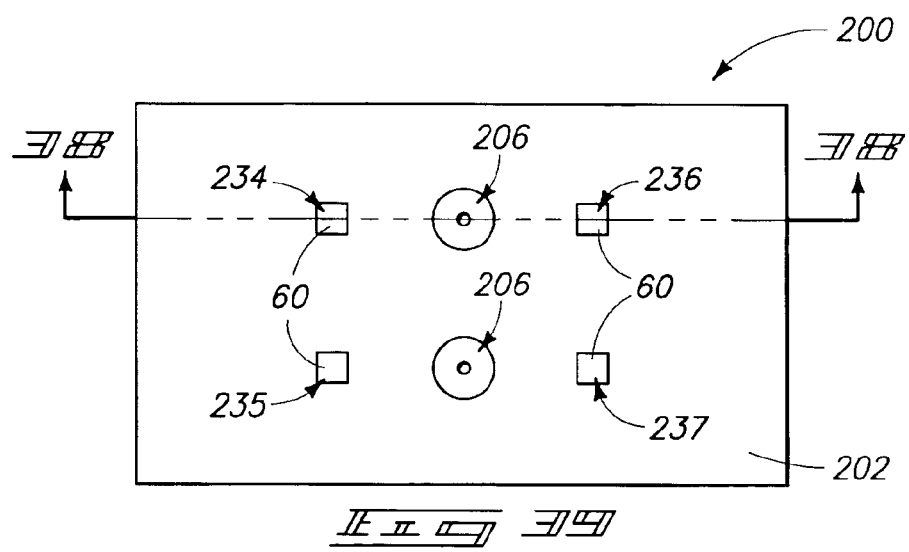
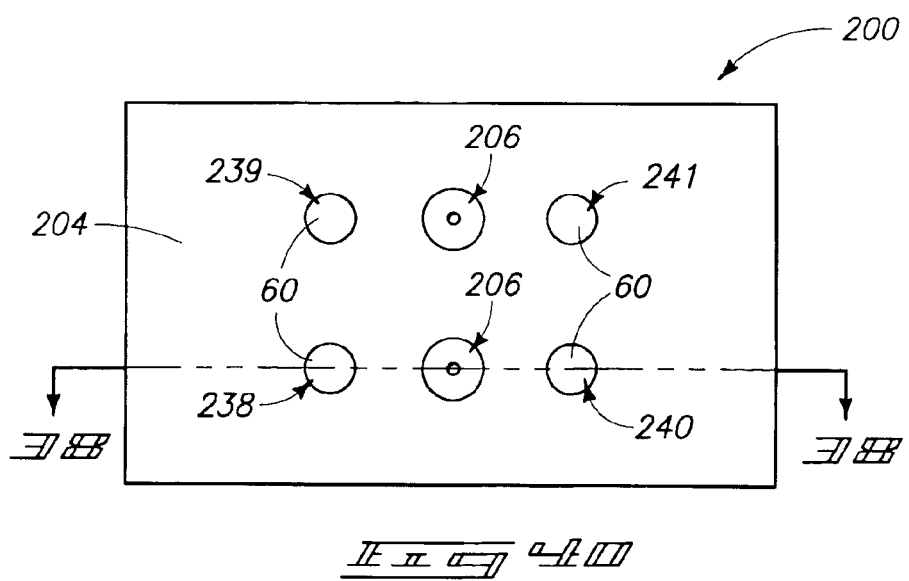

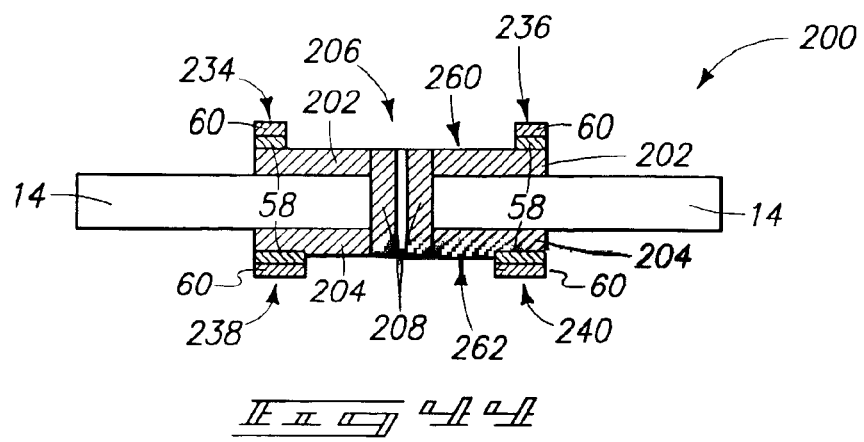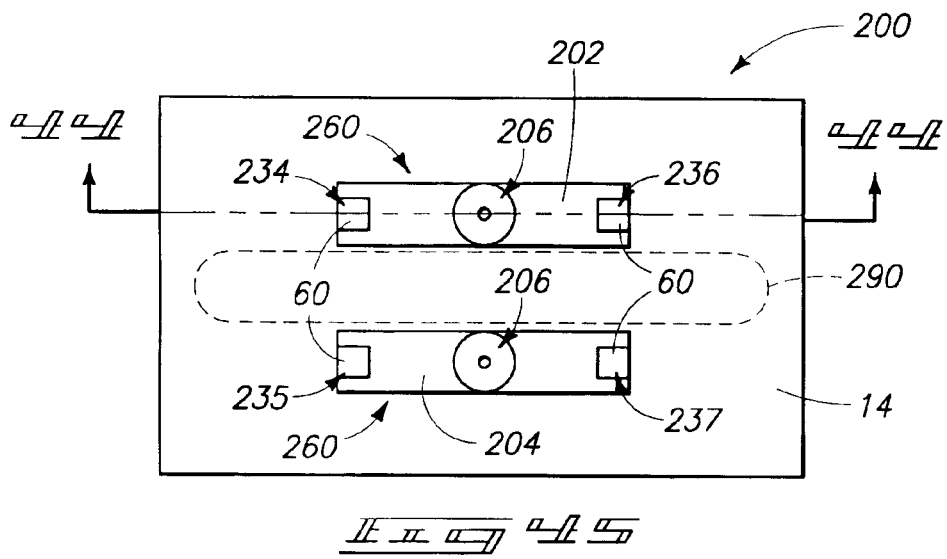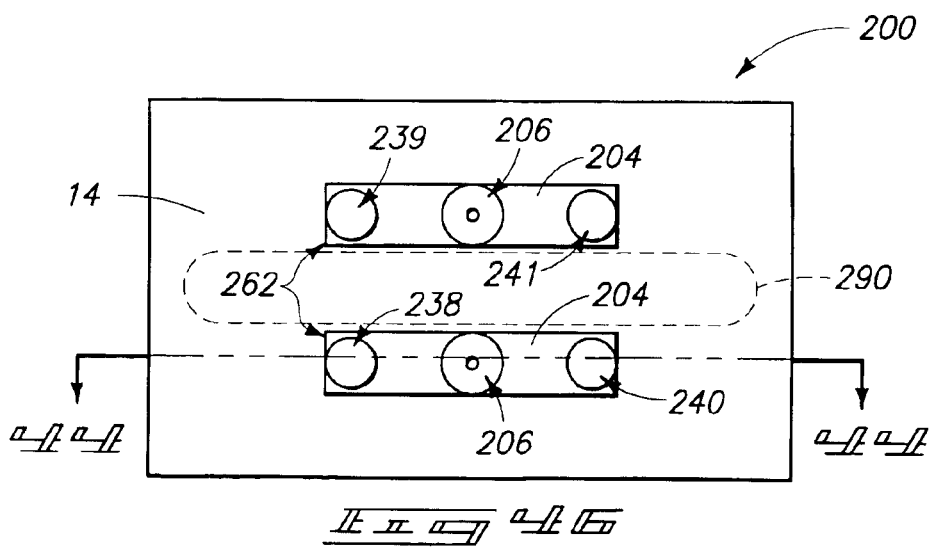

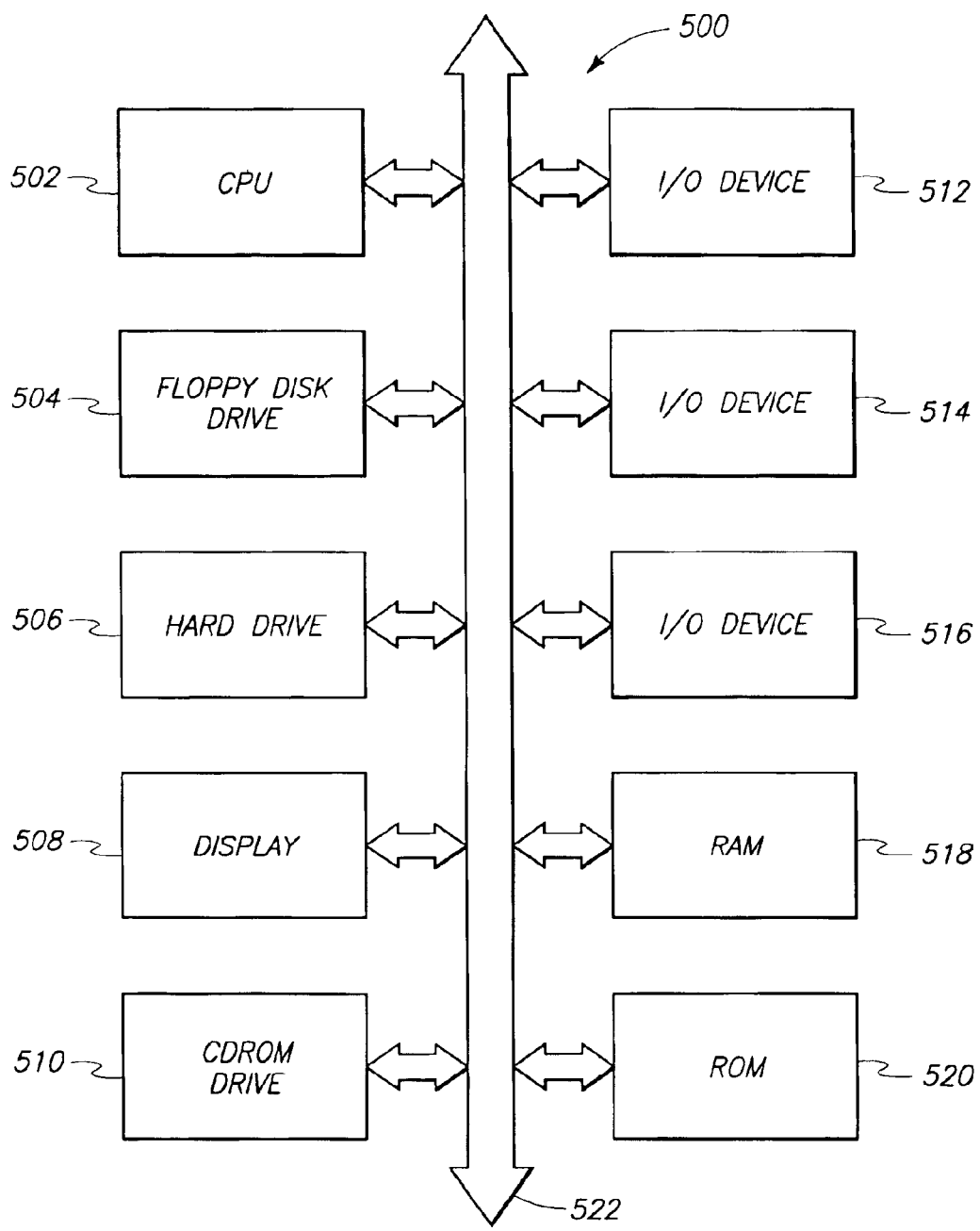

METHODS OF FORMING CIRCUIT TRACES AND CONTACT PADS FOR INTERPOSERS UTILIZED IN SEMICONDUCTOR PACKAGES

TECHNICAL FIELD

The present invention pertains to methods of fabricating circuit traces and contact pads for interposers utilized in semiconductor packages.

BACKGROUND OF THE INVENTION

Semiconductor devices, for example, dynamic random access memory (DRAM) devices, are shrinking in the sense that smaller devices are being manufactured that are able to handle larger volumes of data at faster data transfer rates. As a result, semiconductor manufacturers are moving toward chip-scale packages (CSP) for semiconductor components which have a small size and fine pitch wiring.

Exemplary CSPs are shown in FIGS. 1 and 2 as a flip-chip-in-package-board-on-chip (FCIP-BOC) package 10 and a board-on-chip BOC package 50, respectively. Each of the packages comprises a semiconductor component 12 (such as, for example, an integrated circuit (IC) chip), and can thus be referred to as semiconductor packages.

The packages 10 and 50 also comprise an interposer 14 utilized to support the semiconductor component 12. The shown interposer is a board, and such board would typically be a glass weave material. In the case of BOC construction 50, chip 12 is attached to board 14 through an adhesive 16. In the case of FCIP-BOC construction 10, the attachment between the chip 12 and board 14 is through a series of electrical contacts 18 and/or 36. Each of the illustrated contacts 18 comprises an electrically conductive interconnect material 20 (shown as a small ball) between a pair of contact pads 22 and 24. The contact pad 22 is associated with chip 12, and the contact pad 24 is associated with board 14. Contact pad 24 will typically comprise a stack of a copper layer, nickel layer and gold layer; with the copper layer being adjacent board 14 and the gold layer being adjacent ball 20 of interconnect 18. Contact pads 22 can comprise constructions analogous to those of contact pads 24.

Constructions 10 and 50 are shown comprising contact pads 30 on an underside of the board 14 (i.e., on a side of board 14 in opposing relation relative to the side proximate chip 12), and comprising electrically conductive interconnect material (shown as solder balls 32) on the contact pads 30. Contact pads 30 can comprise constructions analogous to those described above with reference to pads 24, and accordingly can comprise stacks of copper, nickel and gold. Solder balls 32 are utilized to form electrical interconnections between contact pads 30 and other circuitry (not shown) external of the chip package (i.e., the package 10 or the package 50).

The boards 14 have orifices 34 extending therethrough. Wire bonds 36 extend from contact pads 38 associated with chips 12 to contact pads 40 associated with an underside of board 14. The contact pads 40 can be connected with pads 30 through circuit traces (not shown in the views of FIGS. 1 and 2). The FCIP-BOC construction 10 also comprises conductive vias 42 extending through board 14 to connect selected contact pads 24 above the board with selected contact pads 30 beneath the board.

Suitable encapsulant 44 can be provided over the chip 12, around the wire bonds 36, and within orifice 34 as shown.

From the discussion above it can be recognized that FCIP-BOC construction 10 is similar to BOC construction 50, with the primary differences being that FCIP-BOC construction 10 comprises contacts formed both above and below board 14 (i.e., on opposing surfaces of board 14), whereas BOC construction 50 has contacts formed only beneath board 14.

The invention described herein includes methods of forming boards and other interposers utilized in semiconductor packages. The methods can be utilized in, for example, forming either FCIP-BOC constructions or BOC constructions. Before discussing the methods of the present invention, a problem associated with prior art fabrication of boards is described with reference to FIGS. 3–9. The figures show an exemplary process for forming a board of a BOC construction, but it is to be understood that similar methodology is utilized for forming boards utilized in FCIP-BOC constructions, and accordingly problems similar to those described with reference to FIGS. 3–9 also occur in forming boards associated with FCIP-BOC constructions.

Referring to FIGS. 3 and 4, a construction 51 is shown at a preliminary stage of a prior art process of fabricating the board for utilization in a BOC construction. The construction is shown in a cross-sectional view in FIG. 3, and in a top view in FIG. 4.

Construction 51 includes a board 14. Board 14 comprises a first surface 15 and a second surface 17 in opposing relation to first surface 15. A conductive layer 52 is provided over first surface 15. Conductive layer 52 will typically comprise, for example, copper, and can have an initial thickness of greater than 10 microns, with a typical thickness being about 12 microns. Since the shown board is to be utilized for forming a BOC construction, conductive layer 52 is only along one of the surfaces 15 and 17. However, if board 14 were to be utilized in forming a FCIP-BOC construction, the conductive material would be formed along both of surfaces 15 and 17.

FIGS. 5 and 6 show construction 51 at a processing stage subsequent to that of FIGS. 3 and 4 along cross-sectional and top views, respectively. Layer 52 is patterned into a series of circuit traces 54. It is noted that an alternative route to obtain the construction of FIGS. 5 and 6, other than that shown in FIGS. 3–6, is to start with a construction having conductive material 52 over both of opposing sides 15 and 17 at the processing stage of FIG. 3, and to etch the conductive material from over side 17 while forming the traces 54 of FIGS. 5 and 6.

FIGS. 7 and 8 show construction 51 at a processing stage subsequent to that of FIGS. 5 and 6, along cross-sectional and top views, respectively. A series of conductive busses 56 (shown in FIG. 8) are formed across upper surface 15 of board 14, and utilized to form electrical connections to traces 54. Subsequently, a patterned mask (not shown) is formed over portions of traces 54 while leaving portions 62 exposed for formation of contact pads 30. Contact pads are formed electrolytically. Specifically, busses 56 are connected to a power source (not shown), and subsequently conductive layers 58 and 60 are plated onto the contact pad locations of traces 54 to form the contact pads 30. Layers 58 and 60 can comprise, consist essentially of, or consist of, for example, nickel and gold, respectively; and can be referred to as a nickel-containing layer and a gold-containing layer, respectively.

FIG. 9 shows a top view of construction 51 in a processing stage subsequent to that of FIG. 8. Specifically, orifice 34 has been formed to extend through board 14. Orifice 34 can be formed utilizing, for example, a router. The forming of orifice 34 removes the majority of busses 56 from board 14. However, remaining portions of busses 56 can problematically leave burrs 70 along edges of orifice 34. Also, the busses can have a so-called "antenna effect" on high speed traces, which can impair high frequency electrical performance.

Other problems of prior art processes of forming conductive traces and contact pads for board substrates can include utilization of unstable plating solutions, poor wirebondability, slow plating processes, difficulty in achieving thick platings, and high cost due to, among other things, complexities of incorporating busses into design space.

In light of the above-discussed problems, it is desirable to develop new methods of forming interposers suitable for incorporation into semiconductor packages.

SUMMARY OF THE INVENTION

In one aspect, the invention encompasses a method of forming circuit traces and contact pads for an interposer utilized in a semiconductor package. An interposer substrate having a pair of opposing surfaces is provided. The opposing surfaces are defined as a first surface and a second surface, and the substrate has a first conductive material extending at least over the first surface. Pads are formed over the first conductive material by plating a second conductive material over the first conductive material while using the first conductive material as an electrical connection to a power source. After the plating, the first conductive material is patterned into electrical traces. The semiconductor package can be, for example, either a FCIP-BOC construction or a BOC construction.

In one aspect, the invention encompasses a method for forming a BOC package. An interposer substrate (in this case a board substrate), is provided. The substrate has a surface, and a first conductive layer over such surface. A first patterned mask is formed over the first conductive layer. The first patterned mask has openings extending therethrough to the first conductive layer, with the openings defining circuit trace locations. A second conductive layer is formed over and in physical contact with portions of the first conductive layer exposed through the openings. The second conductive layer is thus formed at the circuit trace locations, and is formed in a circuit trace pattern. A second patterned mask is formed to cover regions of the first conductive layer while leaving other regions exposed. The exposed regions define contact pad locations. Conductive materials are plated over the contact pad locations, and the first and second patterned masks are then removed. The circuit trace pattern is then transferred to the first conductive layer with a suitable etch.

In one aspect, the invention encompasses a method of forming a board for utilization in a FCIP-BOC package. A board substrate is provided. The substrate has a pair of opposing surfaces, with the opposing surfaces being defined as a first surface and a second surface. A first conductive layer is formed over the first surface, and a second conductive layer is formed over the second surface. A first patterned mask is formed over the first and second conductive layers. The first patterned mask has openings extending therethrough to the first and second conductive layers. The openings define contact pad locations. A third conductive layer is formed over and in physical contact with portions of the first and second conductive layers exposed through the openings. The third conductive layer is thus formed at the contact pad locations. The first patterned mask is removed.

A second patterned mask is then formed over the first and second conductive layers. The second patterned mask protects regions of the first and second conductive layers while exposing other regions. The protected regions define circuit traces to at least some of the contact pad locations. Unprotected regions of the first and second conductive layers are removed to form the circuit traces from the first and second conductive layers. Subsequently, the second patterned mask is removed.

BRIEF DESCRIPTION OF THE DRAWINGS

Preferred embodiments of the invention are described below with reference to the following accompanying drawings.

FIG. 10 is a diagrammatic cross-sectional side view of a board construction shown at a preliminary processing stage of a method of the present invention.

FIGS. 11 and 12 are a diagrammatic cross-sectional side view and a diagrammatic top view, respectively, of the construction of FIG. 10 shown at a processing stage subsequent to that of FIG. 10. The cross-section of FIG. 11 is shown along the line 11—11 of FIG. 12.

FIGS. 13 and 14 are a diagrammatic cross-sectional side view and a diagrammatic top view, respectively, of the construction of FIG. 10 shown at a processing stage subsequent to that of FIGS. 11 and 12. The cross-section of FIG. 13 is shown along the line 13—13 of FIG. 14.

FIGS. 15 and 16 are a diagrammatic cross-sectional side view and a diagrammatic top view, respectively, of the construction of FIG. 10 shown at a processing stage subsequent to that of FIGS. 13 and 14. The cross-section of FIG. 15 is shown along the line 15—15 of FIG. 16.

FIGS. 17 and 18 are a diagrammatic cross-sectional side view and a diagrammatic top view, respectively, of the construction of FIG. 10 shown at a processing stage subsequent to that of FIGS. 15 and 16. The cross-section of FIG. 17 is shown along the line 17—17 of FIG. 18.

FIGS. 19 and 20 are a diagrammatic cross-sectional side view and a diagrammatic top view, respectively, of the construction of FIG. 10 shown at a processing stage subsequent to that of FIGS. 17 and 18. The cross-section of FIG. 19 is shown along the line 19—19 of FIG. 20.

FIGS. 29, 30 and 31 are a diagrammatic cross-sectional side view, diagrammatic top view and diagrammatic bottom view, respectively, of the board construction of FIGS. 26–28 shown at a processing stage subsequent to that of FIGS. 26–28. The cross-section of FIG. 29 is shown along the lines 29—29 of FIGS. 30 and 31.

FIGS. 32, 33 and 34 are a diagrammatic cross-sectional side view, diagrammatic top view and diagrammatic bottom view, respectively, of the board construction of FIGS. 26–28 shown at a processing stage subsequent to that of FIGS. 29–31. The cross-section of FIG. 32 is shown along the lines 32—32 of FIGS. 33 and 34.

FIGS. 38, 39 and 40 are a diagrammatic cross-sectional side view, diagrammatic top view and diagrammatic bottom view, respectively, of the board construction of FIGS. 26–28 shown at a processing stage subsequent to that of FIGS. 35–37. The cross-section of FIG. 38 is shown along the lines 38—38 of FIGS. 39 and 40.

FIGS. 44, 45 and 46 are a diagrammatic cross-sectional side view, diagrammatic top view and diagrammatic bottom view, respectively, of the board construction of FIGS. 26–28 shown at a processing stage subsequent to that of FIGS. 41–43. The cross-section of FIG. 44 is shown along the lines 44—44 of FIGS. 45 and 46.

FIG. 47 shows a processor system including a semiconductor package formed in accordance with methodologies of the present invention.

DETAILED DESCRIPTION OF THE PREFERRED EMBODIMENTS

Figure 1:
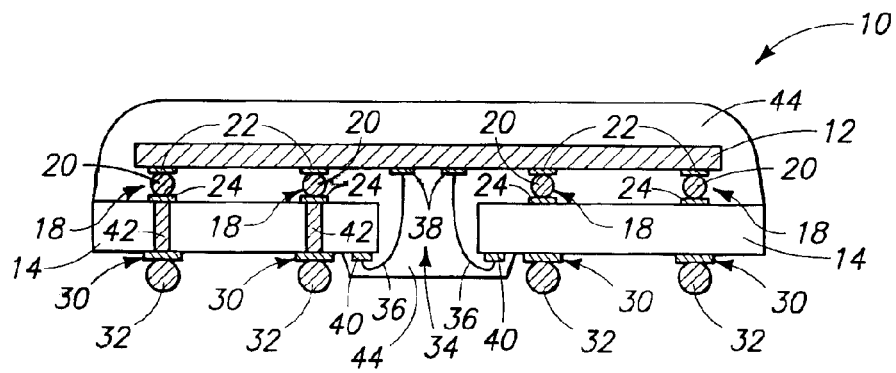
FIG. 1 is a diagrammatic cross-sectional side view of a prior art FCIP-BOC semiconductor package construction.
Figure 2:
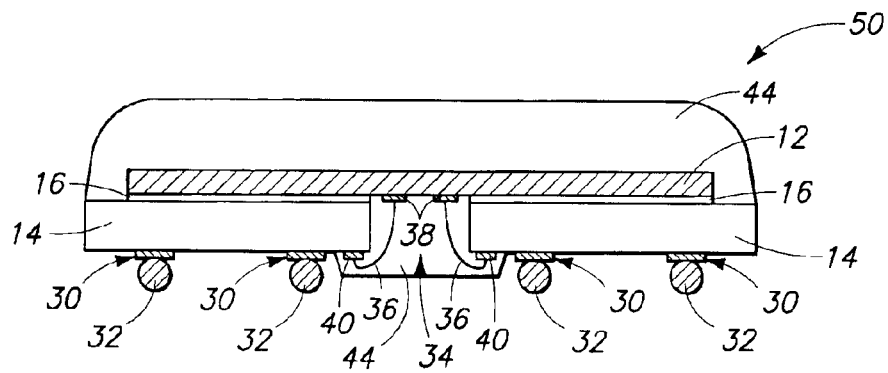
FIG. 2 is a diagrammatic cross-sectional side view of a prior art board-on-chip semiconductor package construction.
Figure 3:
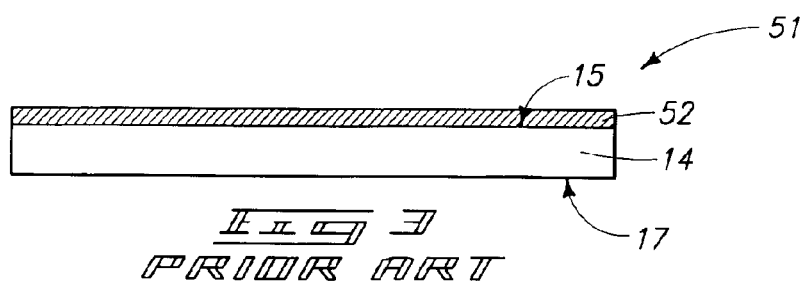
FIGS. 3 and 4 are a diagrammatic cross-sectional side view, and a diagrammatic top view, respectively, of a board construction at a preliminary processing stage of a prior art method for fabricating a board for inclusion within a semiconductor package. The cross-section of FIG. 3 is shown along the line 3—3 of FIG. 4.
Figure 4:
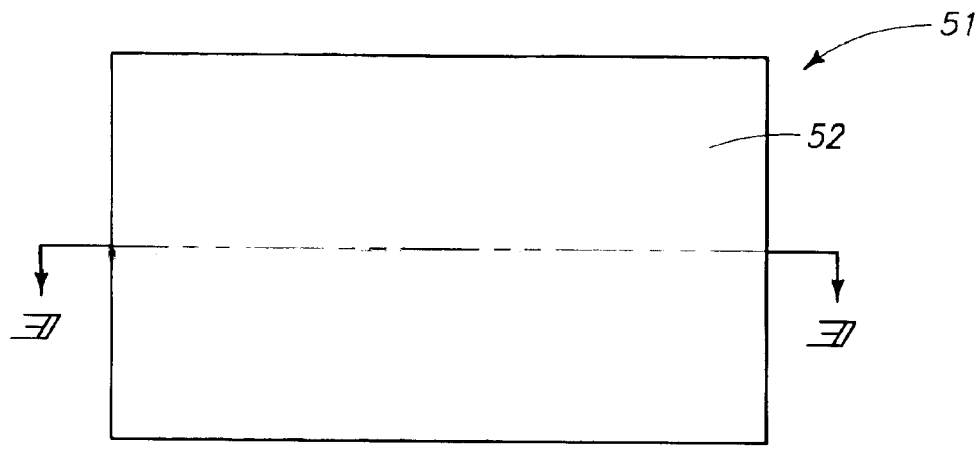
Figure 5:
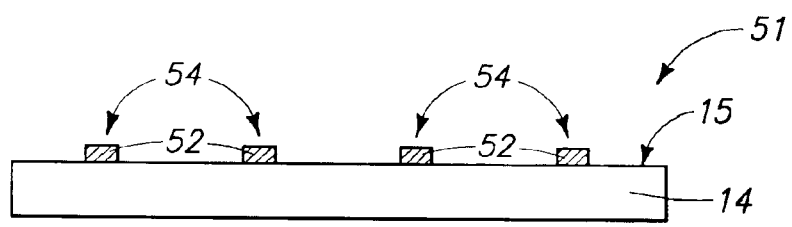
FIGS. 5 and 6 are a diagrammatic cross-sectional side view and a diagrammatic top view, respectively, of the board construction of FIGS. 3 and 4 shown at a prior art processing stage subsequent to that of FIGS. 3 and 4. The cross-section of FIG. 5 is shown along the line 5—5 of FIG. 6.
Figure 6:
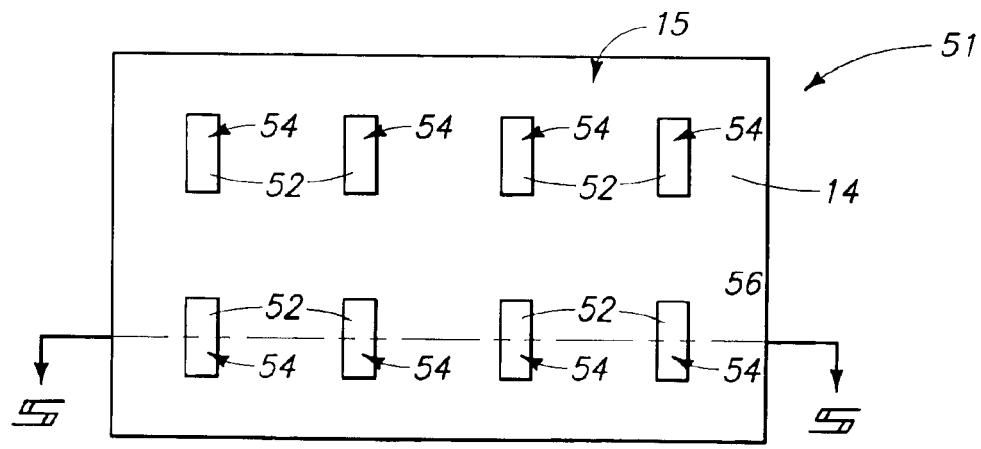
Figure 7:
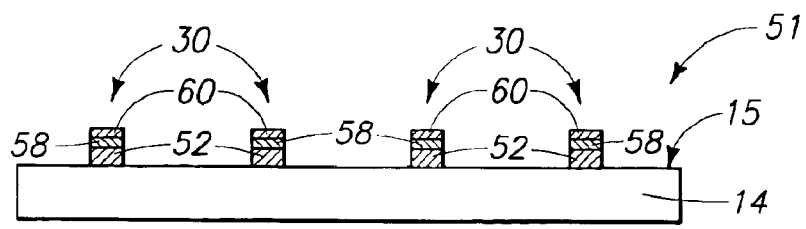
FIGS. 7 and 8 are a diagrammatic cross-sectional side view and a diagrammatic top view, respectively, of the board construction of FIGS. 3 and 4, shown at a prior art processing stage subsequent to that of FIGS. 5 and 6. The cross-section of FIG. 7 is shown along the line 7—7 of FIG. 8.

This disclosure of the invention is submitted in furtherance of the constitutional purposes of the U.S. Patent Laws "to promote the progress of science and useful arts" (Article 1, Section 8).

The invention includes methods for forming interposer substrates (e.g., board substrates) suitable for utilization in semiconductor packages. The methods eliminate the bus lines traditionally used during the plating of conductive materials at contact pad locations. The elimination of the bus lines can simplify fabrication relative to prior art processes, in that it eliminates the processing steps utilized for forming the bus lines. Also, it can eliminate problems associated with residual bus lines in conventional processing, such as, for example, the burrs described with reference to prior art FIG. 9, and the antenna effect described in the "Background" section of this disclosure.

Methodologies of the present invention are suitable for forming interposers (for example, boards, lead-frames, etc.) suitable for utilization in a diverse array of semiconductor packages. Exemplary packages include FCIP-BOC constructions, BOC constructions and chip-on-board (COB) constructions. The exemplary applications which follow utilize board substrates for fabrication of exemplary BOC and FCIP-BOC constructions, but it is to be understood that the invention can be utilized for forming packages other than BOC and FCIP-BOC constructions, and that the methodology described herein can be utilized with other interposer substrates besides board substrates.

FIGS. 10–24 pertain to a first embodiment of the invention, and FIGS. 26–46 pertain to a second embodiment of the invention. The first embodiment is described with reference to a board suitable for utilization in a BOC construction, and the second embodiment is described with reference to a board suitable for utilization in a FCIP-BOC construction. In referring to the embodiments that follow, similar numbering will be used as was utilized in describing the prior art of FIGS. 1–9, where appropriate.

Referring initially to FIG. 10, a board construction 51 is illustrated at a preliminary processing stage of a method of the present invention. Construction 51 of FIG. 10 is similar to the construction described previously with reference to FIG. 3, and accordingly comprises a layer 52 of conductive material over a surface 15 of a substrate 14. Layer 52 can comprise, consist essentially of, or consist of copper. In particular aspects, layer 52 can predominately comprise copper, with the term "predominately comprise" indicating that the layer comprises more than 50 atomic % copper.

Layer 52 can be initially provided to a thickness of at least about 10 microns, with a typical thickness being about 12 microns. Layer 52 can be referred to as a first conductive layer in the discussion that follows to distinguish layer 52 from subsequent conductive layers formed thereover.

Referring to FIGS. 11 and 12, layer 52 is thinned. The thickness of layer 52 can be reduced to less than or equal to about 5 microns, and typically will be reduced to about 3 microns. FIG. 12 shows that the conductive layer can extend across an entirety of a surface of substrate 14 (the substrate is visible in the cross-sectional view of FIG. 11).

Referring to FIGS. 13 and 14, a patterned mask 100 is formed over conductive layer 52. Patterned mask 100 can be formed from, for example, a dry film provided over layer 52 and subsequently photolithographically patterned. Openings 102 extend through patterned mask 100 to conductive layer 52. The openings 102 define a circuit pattern.

Referring to FIGS. 15 and 16, a second conductive layer 104 is grown over first conductive layer 52 within openings 102. Second conductive layer 104 can be formed by, for example, electrolytic processing, and accordingly can be plated over first conductive layer 52. In particular aspects, second conductive layer 104 will comprise, predominately comprise, consist essentially of, or consist of, copper. Accordingly, second conductive layer 104 can be substantially identical in composition to first conductor layer 52, and specifically, layers 52 and 104 can both predominately comprise, consist essentially of, or consist of copper.

Second conductive layer 104 can be formed to a thickness of at least about 10 microns, and in particular aspects will be formed to a thickness of at least about 12 microns. In some aspects, a combined thickness of layers 52 and 104 can be greater than about 10 microns, and in particular aspects the combined thickness can be about 12 microns. Second conductive layer 104 is formed in physical contact with first conductive layer 52, and is formed in the circuit pattern defined by openings 102.

Referring to FIGS. 17 and 18, a second patterned mask 106 is formed over first patterned mask 100 and over portions of the circuit pattern defined by first patterned mask 100, while leaving some portions of the circuit pattern exposed. The covered portions are labeled 108 in FIG. 18, and the openings extending through second mask 106 are labeled 110. The covered portions of the circuit pattern are shown in dashed line in the top view of FIG. 18 to indicate that such portions are under mask 106, while the exposed portions are shown surrounded by a solid-line periphery. Although second mask 106 is shown formed over first mask 100, it is to be understood that the invention includes other aspects (not shown) in which mask 100 is removed prior to forming mask 106.

The openings 1 10 extending through mask 106 can be considered to define contact pad locations, and the portions of second conductive layer 104 exposed through openings 110 can be considered to correspond to the contact pad locations.

Materials 58 and 60 are formed over the portions of second conductive layer 104 exposed within openings 110 of second patterned mask 106 (i.e., are plated over the contact pad locations), and form contact pads 30. Materials 58 and 60 can be referred to as a third conductive layer and a fourth conductive layer, respectively, in the discussion and claims that follow. Materials 58 and 60 can correspond to the same materials traditionally utilized in contact pads. Accordingly, material 58 can comprise, consist essentially of, or consist of nickel; and material 60 can comprise, consist essentially of, or consist of gold. In some applications, layer 60 can be omitted; and in some applications, one or both of layers 58 and 60 can predominately comprise an element selected from the group consisting of palladium, nickel and gold.

Layers 58 and 60 can be formed electrolytically over conductive material 104. Specifically, materials 58 and 60 can be plated over conductive material 104 while providing electrical power to the conductive material 104. Electrical power can be provided from a source 112 connected to conductive layer 52. In particular aspects of the present invention, conductive layer 52 will be the only conductive interconnect (i.e., bus) extending across substrate 14 between layer 104 and power source 112. In other words, the bus lines 56 described above with reference to FIGS. 8 and 9 are eliminated. The plating solutions utilized during plating of materials 58 and 60 can be chosen for appropriate chemical stability.

Figure 20:
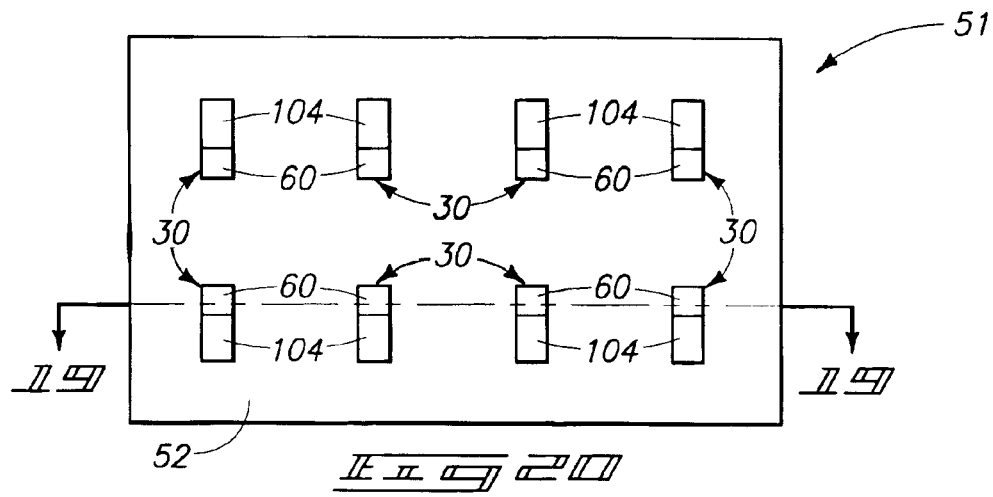

Referring to FIGS. 19 and 20, first and second patterned masks 100 and 106 (FIGS. 17 and 18) are removed.

Figure 21:
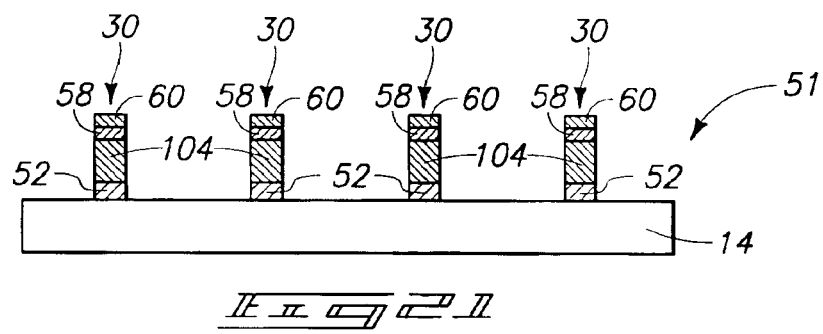
FIGS. 21 and 22 are a diagrammatic cross-sectional side view and a diagrammatic top view, respectively, of the construction of FIG. 10 shown at a processing stage subsequent to that of FIGS. 19 and 20. The cross-section of FIG. 21 is shown along the line 21—21 of FIG. 22.
Figure 22:
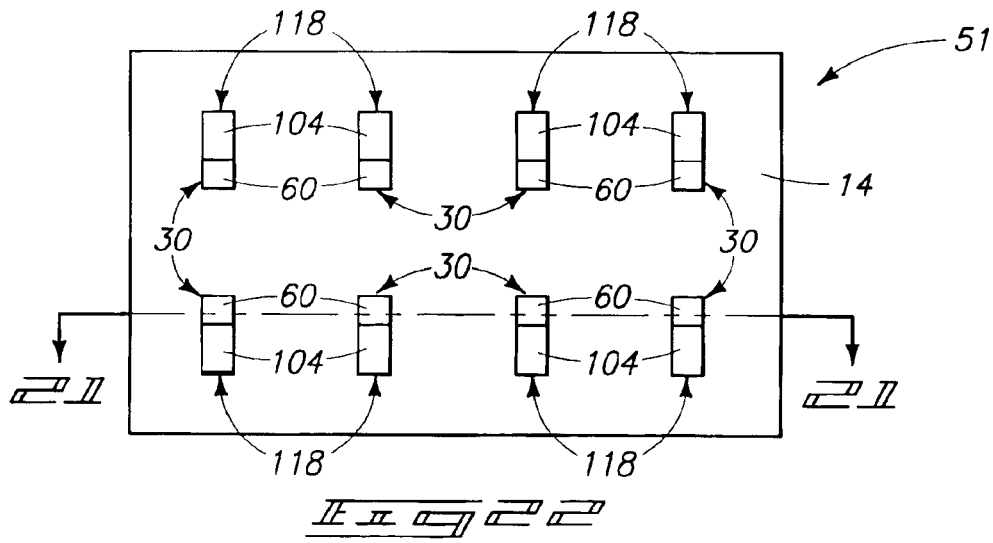

Referring next to FIGS. 21 and 22, layers 104, 58 and 60 are utilized as a patterned mask during an etch of first conductive layer 52. Such patterns first conductive layer 52 into electrical traces aligned with the materials of layers 104, 58 and 60 thereover. In the shown aspect of the invention, the traces have the rectangular shapes visible in the top view of FIG. 22 as combinations of materials 104 and 60, with the individual discrete traces being labeled as 118 in FIG. 22.

Figure 23:
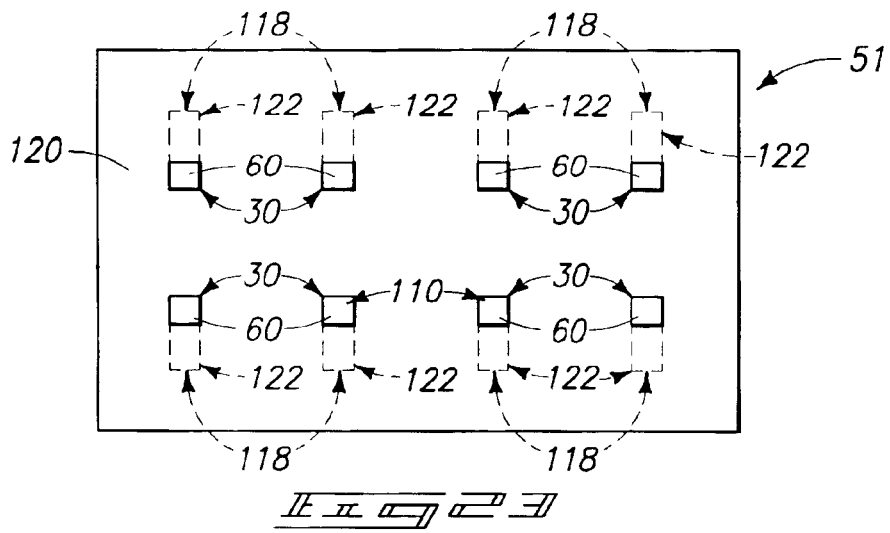
FIG. 23 is a diagrammatic top view of the FIG. 10 construction shown at a processing stage subsequent to that of FIGS. 21 and 22.

Referring to FIG. 23, a patterned mask 120 is formed over construction 51 to cover portions 122 of traces 118 (the covered portions are shown in phantom, dashed-line view in FIG. 23), while leaving contact pads 30 exposed. Mask 120 can be referred to as a solder mask, and is utilized to define locations where solder balls are to be provided in a ball grid array. Such locations correspond to the locations of contact pads 30. As will be understood by persons of ordinary skill in the art, the openings extending to contact pads 30 can expose the entire area of the contact pads, or can expose only a portion of the area of the contact pads, depending on whether the pads are to be utilized in solder mask defined (SMD) applications or non-solder mask defined (NSMD) applications.

Figure 24:
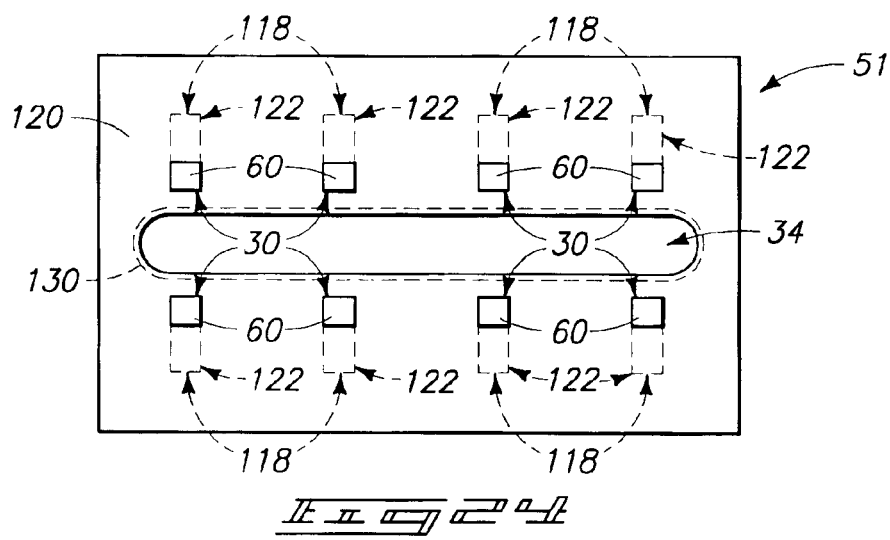
FIG. 24 is a diagrammatic top view of the construction of FIG. 10 shown at a processing stage subsequent to that of FIG. 23.

Referring to FIG. 24, orifice 34 is formed to extend entirely through substrate 14 (visible in the cross-sectional view of FIG. 21) of construction 51. Mask 120 preferably remains in place during formation of orifice 34. Subsequent to the formation of orifice 34, construction 51 can be incorporated into a semiconductor package, such as, for example, the package 50 shown in FIG. 2.

An advantage of the processing of FIGS. 10–24 relative to the prior art processing of FIGS. 2–9, is that the bus lines 56 (FIGS. 8 and 9) have been eliminated from the processing of the present invention. Accordingly, orifice 34 can be formed without formation of the burrs 70 described above with reference to FIG. 9. Other difficulties associated with busses (such as, for example, the antenna effect of the busses) can also be eliminated.

The construction of FIG. 24 can be considered to comprise a central region within which orifice 34 is formed, and a peripheral region surrounding the central region. The circuit traces 118 can be considered to be formed in the peripheral region in the shown embodiment. A dashed line 130 is shown in FIG. 24 as an exemplary demarcation between the central region and the peripheral region. One aspect of the invention is that layers 58 and 60 (shown for example in FIG. 22) have been plated over contact locations 30 by using conductive layer 52 (shown in FIG. 17) as an electrical connection to a power source (112 in FIG. 17) and without utilizing conductive busses, other than the conductive layer 52, extending over any part of the central region of the substrate.

Figure 25:
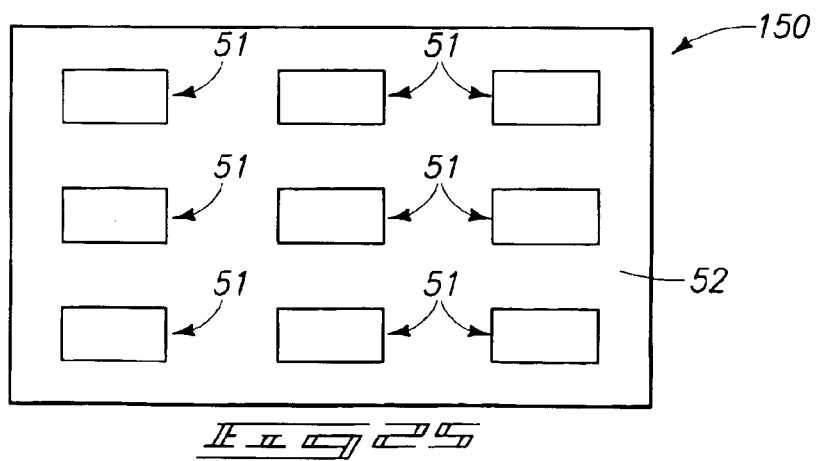
FIG. 25 is a diagrammatic top view of a panel comprising a plurality of board constructions which can be processed simultaneously.

Although the processing of FIGS. 10–24 is described with reference to formation of an individual board construction, it is to be understood that methodology of the present invention can be utilized to form multiple board constructions simultaneously. FIG. 25 shows an exemplary panel 150 at a processing step comparable to that of FIGS. 11 and 12. Panel 150 comprises a base 14 (not visible in the top view of FIG. 25) and a conductive layer 52 over the base. A plurality of board locations 51 are defined across panel 150, and each of the board locations 51 can correspond to an individual board construction of the type described in FIGS. 10–24. All of the boards associated with the panel can be simultaneously subjected to the processing of FIGS. 10–24. During the processing of FIG. 17, electrical power can be provided to layer 52 by providing an electrical contact to the layer at, for example, one or more of the edges of panel 150.

Although the individual board constructions 51 associated with panel 150 are shown separated from one another in the illustration, it is to be understood that the board constructions can be packed tightly together without intervening spaces between adjacent board constructions in other applications (not shown) to increase the number of board constructions formed from an individual panel.

Figure 26:
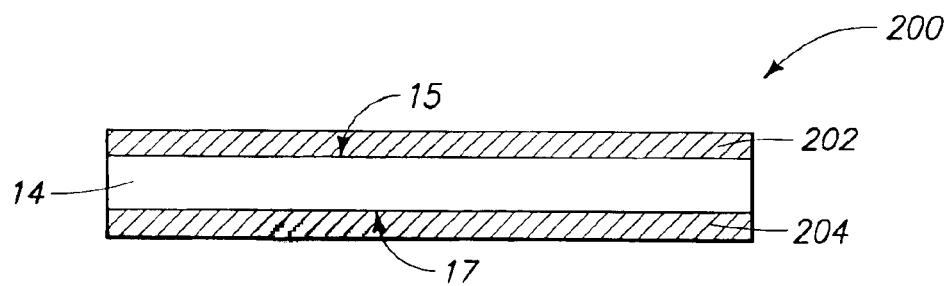
FIGS. 26, 27 and 28 are a diagrammatic cross-sectional side view, diagrammatic top view and diagrammatic bottom view, respectively, of a board construction at a preliminary processing stage of forming a board suitable for utilization in an FCIP-BOC construction in accordance with an aspect of the present invention. The cross-section of FIG. 26 is along the lines 26—26 of FIGS. 27 and 28.
Figure 27:
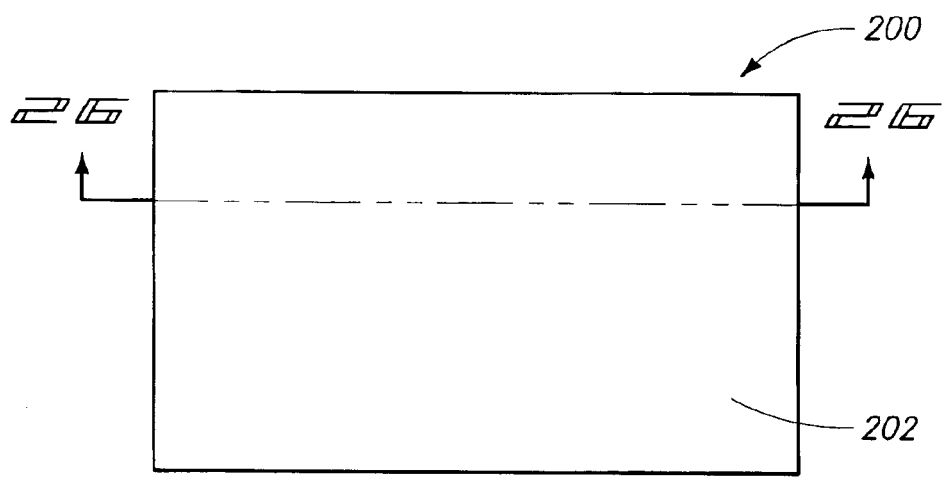
Figure 28:
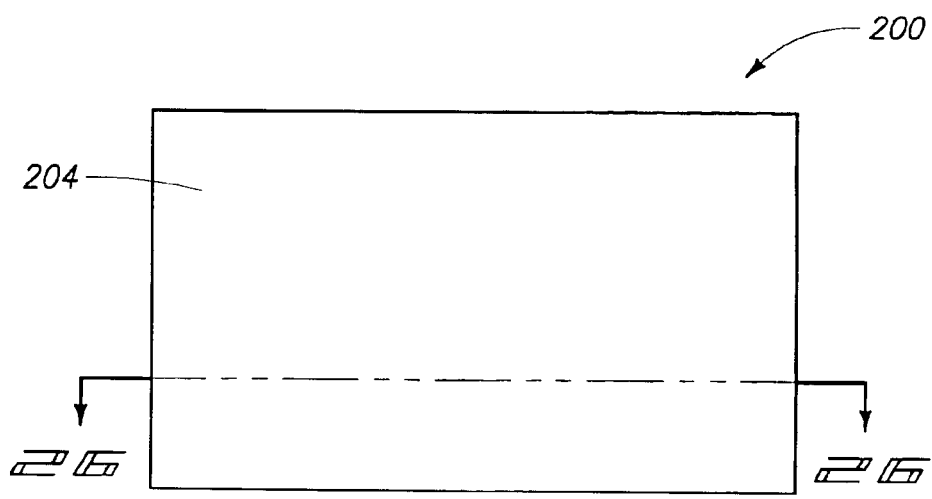

The next embodiment of the invention is described initially with reference to FIGS. 26–28. Such show a construction 200 comprising the substrate 14 having opposing surfaces 15 and 17. Surfaces 15 and 17 can be referred to as first and second surfaces, respectively. A first conductive layer 202 is provided over first surface 15, and a second conductive layer 204 is provided over second conductive surface 17. Conductive layers 202 and 204 can comprise, consist essentially of, or consist of copper. In particular aspects, layers 202 and 204 will predominately comprise copper. Layers 202 and 204 can thus have compositions identical to the composition of the layer 52 described above with reference to FIG. 10. Layers 202 and 204 can each have thicknesses greater than about 10 microns, and in particular aspects will have thicknesses of about 12 microns. As discussed in the brief description of the drawings, FIGS. 27 and 28 correspond to a top view and a bottom view, respectively, of a construction comprising the cross-section of FIG. 26.

Referring next to FIGS. 29–31, openings 206 are formed through substrate 14 together with layers 202 and 204, and subsequently a conductive material 208 is formed within the openings. Openings 206 can be formed by, for example, drilling. Although the openings 206 are shown formed entirely through substrate 14 and layers 202 and 204, it is to be understood that the invention encompasses other aspects (not shown) in which one or more of the openings extend only partially through one or more of substrate 14 and layers 202 and 204. Conductive material 208 can comprise, consist essentially of, or consist of, for example, copper. The openings 206 can ultimately be utilized to form vias, such as, for example, the vias 42 described with reference to prior art FIG. 1. It is to be understood that the vias are optional relative to processing of the present invention, and accordingly can be eliminated in other aspects (not shown).

Referring next to FIGS. 32–34, patterned masks 210 and 212 are formed over exposed surfaces of conductive layers 202 and 204, respectively. Mask 210 has openings 214, 215, 216 and 217 formed therethrough; and mask 212 has openings 218, 219, 220 and 221 formed therethrough. Masks 210 and 212 can correspond to, for example, dry films patterned by photolithography. Openings 218, 219, 220 and 221 are extended into layer 204 (shown in the cross-sectional view of FIG. 32, and specifically shown relative to openings 218 and 220), and openings 214, 215, 216 and 217 are not extended into layer 202. The extension of openings 218, 219, 220 and 221 into layer 204 can be accomplished with a suitable timed etch of the material of layer 204.

Figure 35:
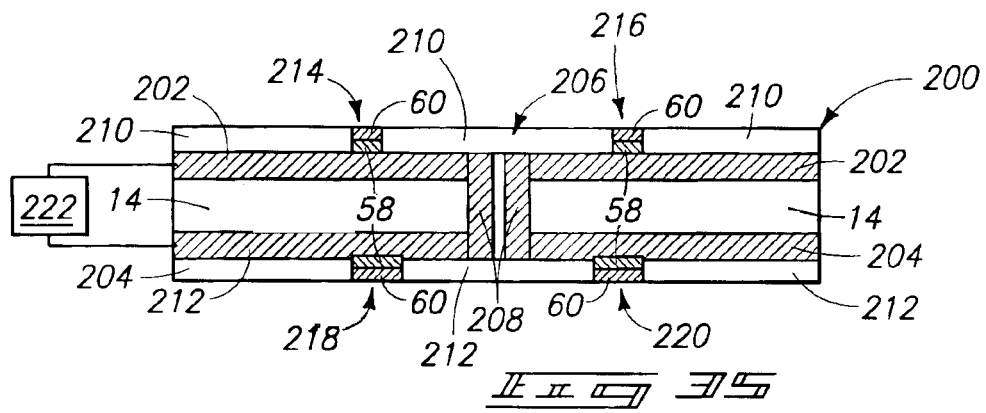
FIGS. 35, 36 and 37 are a diagrammatic cross-sectional side view, diagrammatic top view and diagrammatic bottom view, respectively, of the board construction of FIGS. 26–28 shown at a processing stage subsequent to that of FIGS. 32–34. The cross-section of FIG. 35 is shown along the lines 35—35 of FIGS. 36 and 37.
Figure 36:
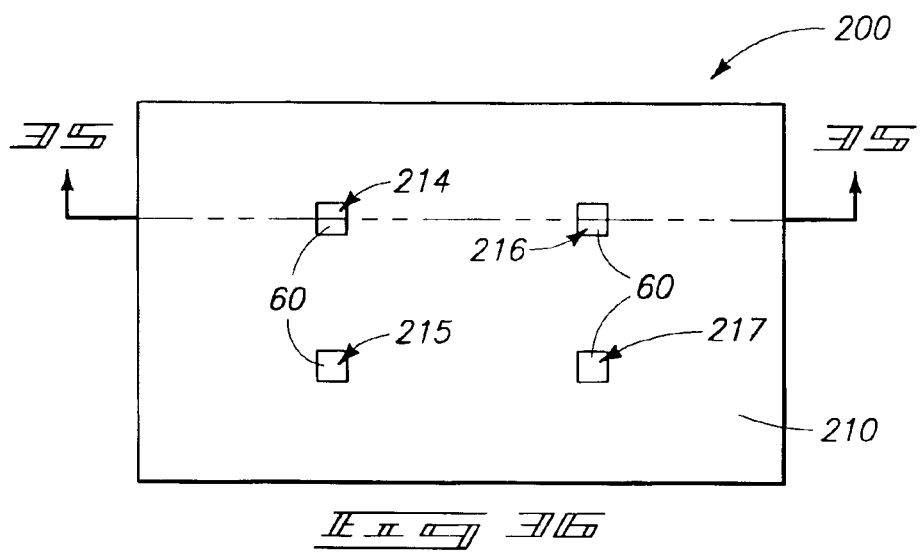
Figure 37:
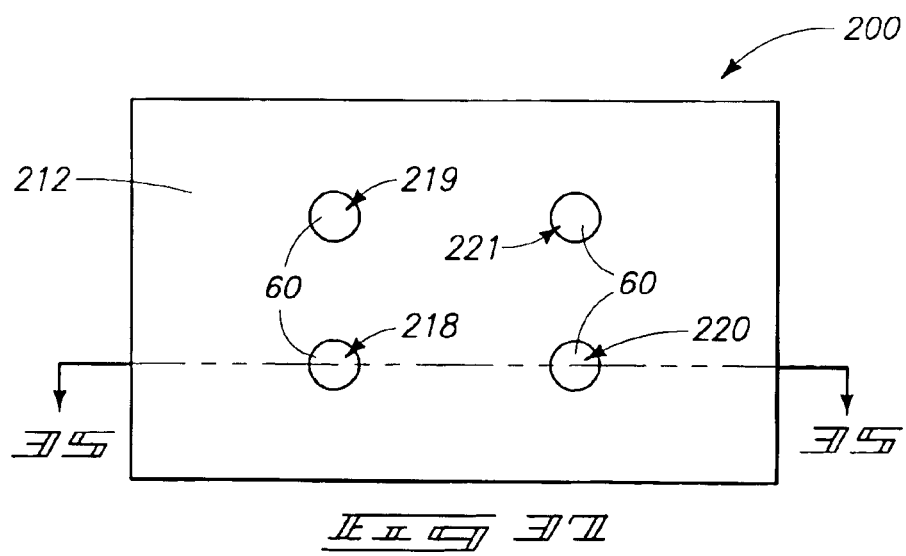

Referring next to FIGS. 35–37, conductive materials 58 and 60 are formed within openings 214, 215, 216, 217, 218, 219, 220 and 221. Conductive materials 58 and 60 can comprise the same materials described previously with reference to FIG. 17. Accordingly, conductive material 58 can comprise, consist essentially of, or consist of nickel; and conductive material 60 can comprise, consist essentially of, or consist of gold. Conductive materials 58 and 60 form contact pads, and openings 214, 215, 216, 217, 218, 219, 220 and 221 therefore correspond to contact pad locations.

Conductive materials 58 and 60 can be formed over conductive layers 202 and 204 utilizing an electrolytic process. Specifically, a power source 222 is connected to layers 202 and 204. The power source is then utilized to provide electrical power to layers 202 and 204 while conductive materials of layers 58 and 60 are electrolytically formed (i.e., plated) within openings 214, 215, 216, 217, 218, 219, 220 and 221. The plating solutions utilized during plating of materials 58 and 60 can be chosen for appropriate chemical stability.

It is noted that layer 58 is shown inset within layer 204 in openings 218 and 220, and is shown on an upper surface of layer 202 within openings 214 and 216. Layer 58 can be inset within an underlying conductive layer if a suitable etch is performed to form an opening extending into such layer (described above with reference to FIGS. 32–34). Alternatively if no such suitable etch is performed, layer 58 will be formed over an exposed upper surface of the conductive layer. In the shown aspect of the invention, layer 204 has been subjected to a suitable etch to allow layer 58 to be inset within layer 204, and layer 202 has not been subjected to such etch. It is to be understood that the invention encompasses other applications (not shown) wherein both of layers 202 and 204 are subjected to the suitable etch to form the inset, as well as other applications in which neither of layers 202 and 204 is subjected to the inset-forming etch. Also, the invention encompasses applications in which layer 202 is subjected to the inset-forming etch and layer 204 is not.

Referring next to FIGS. 38–40, masking layers 210 and 212 (FIGS. 35–37) are removed. Such leaves contact pads 234, 235, 236, 237, 238, 239, 240 and 241 where openings 214, 215, 216, 217, 218, 219, 220 and 221, respectively, had previously been.

Figure 41:
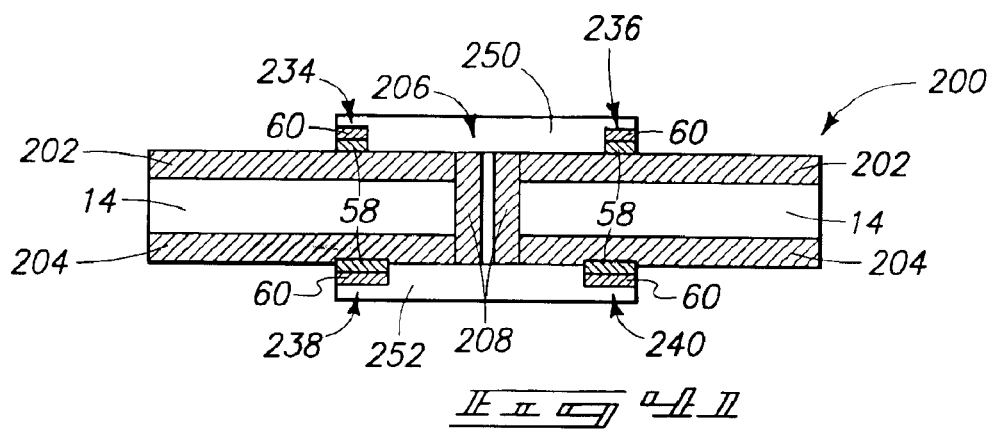
FIGS. 41, 42 and 43 are a diagrammatic cross-sectional side view, diagrammatic top view and diagrammatic bottom view, respectively, of the board construction of FIGS. 26–28 shown at a processing stage subsequent to that of FIGS. 38–40. The cross-section of FIG. 41 is shown along the lines 41—41 of FIGS. 42 and 43.
Figure 42:
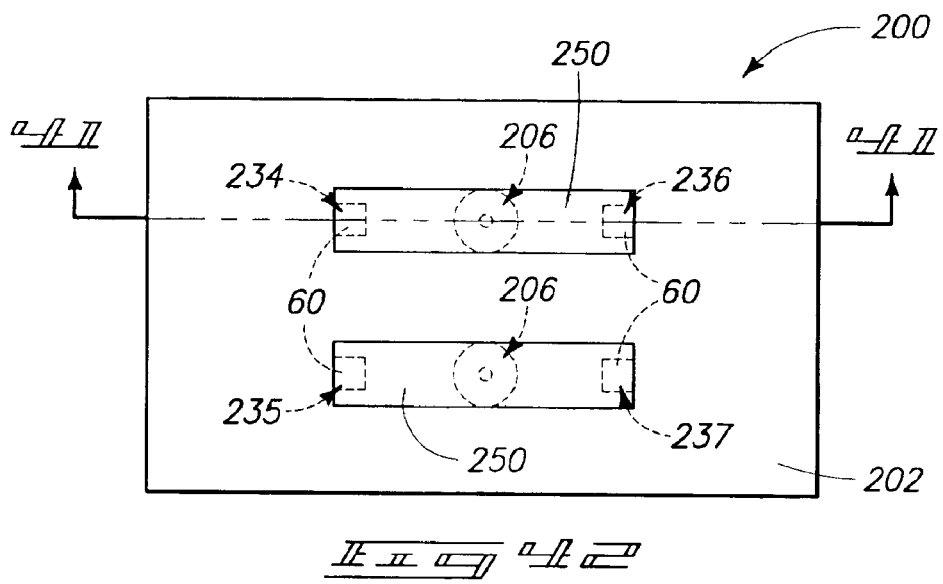
Figure 43:
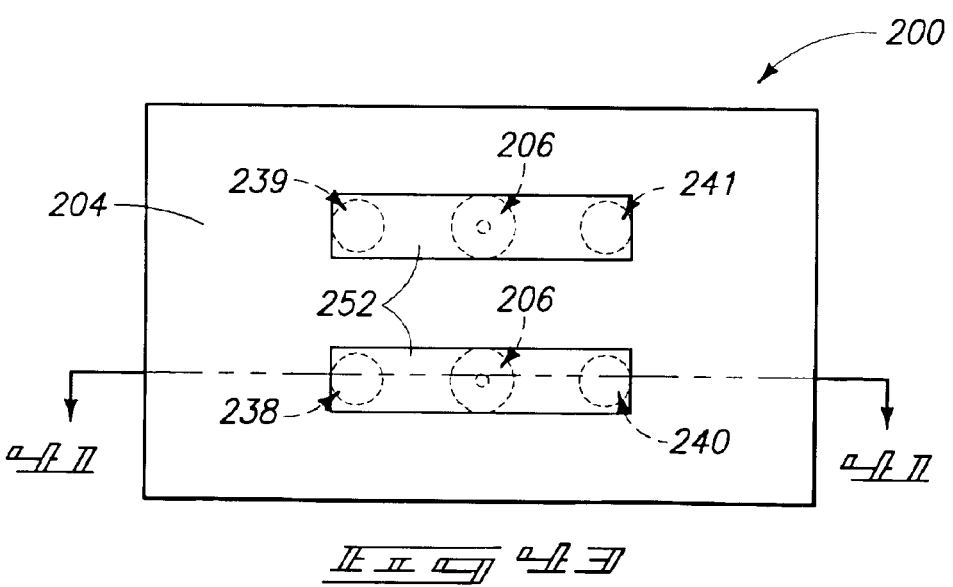

Referring next to FIGS. 41–43, patterned masks 250 and 252 are formed over layers 202 and 204, respectively, and over contact pads 234, 235, 236, 237, 238, 239, 240 and 241. Masks 250 and 252 can comprise, for example, dry films patterned using photolithographic processing. Masks 250 and 252 define circuit traces. Specifically, masks 250 and 252 cover portions of underlying layers 202 and 204 which are to be incorporated into circuit traces, and leave other portions of layers 202 and 204 exposed.

Referring next to FIGS. 44–46, the exposed portions of layers 202 and 204 are removed, and subsequently patterned masks 250 and 252 (FIGS. 41–43) are removed to leave the patterned circuit traces 260 and 262 remaining over substrate 14. The circuit traces extend to and between conductive pads 234, 235, 236, 237, 238, 239, 240 and 241. The circuit traces also extend between the conductive pads and the vias 206.

In subsequent processing, not shown, an orifice (or opening) 34 analogous to the orifice described previously with reference to FIG. 24 can be formed across a middle section of substrate 200, and the substrate can then be incorporated into a semiconductor chip package, such as, for example, the package 10 described with reference to FIG. 1. A central region for formation of the orifice is illustrated diagrammatically in FIGS. 45 and 46 utilizing the dashed line 290 to demarcate a central region (the region within the dashed line) from a peripheral region (the region outward of the dashed line).

The various contact pads formed relative to substrate 200 can be utilized in NSMD constructions, and/or SMD constructions. The SMD approach can be more preferred in particular aspects of the invention.

Figure 8:
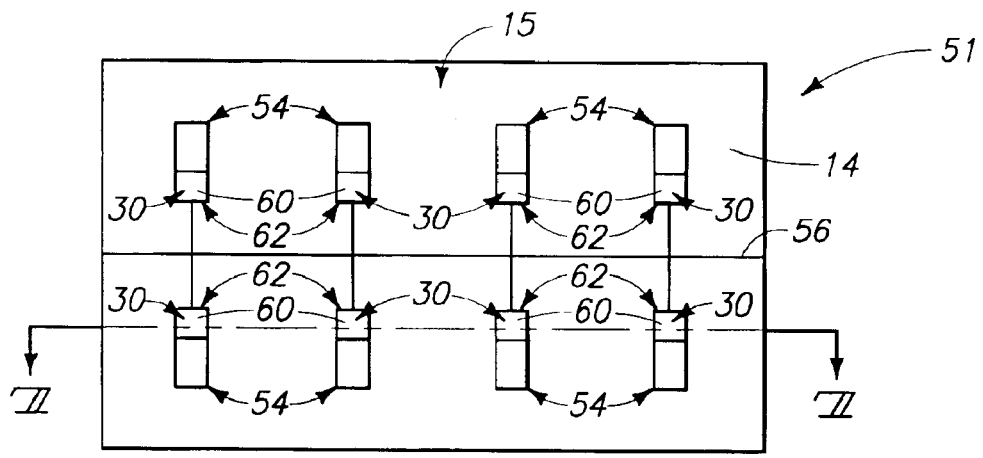
Figure 9:
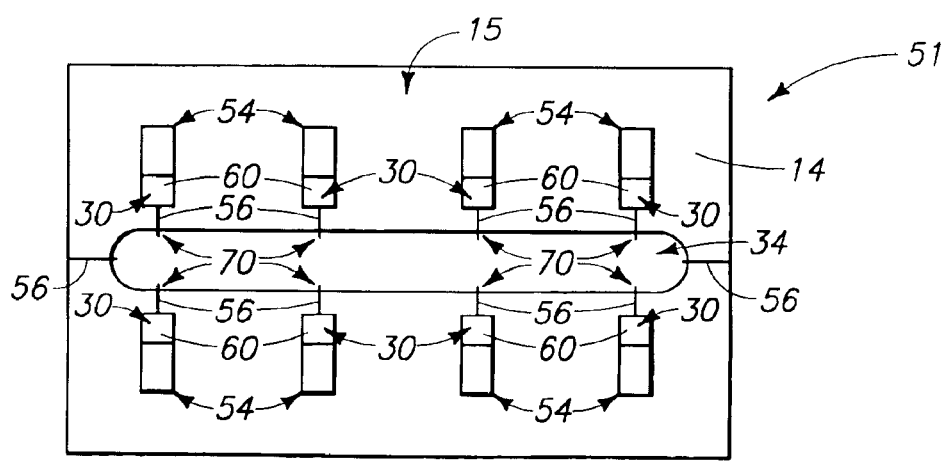
FIG. 9 is a top view of the board construction of FIGS. 3 and 4 shown at a prior art processing stage subsequent to that of FIGS. 7 and 8.

The processing of FIGS. 26–46 has, like the above-described processing of FIGS. 10–24, plated contact pads without utilization of prior art busses (such as, for example, the busses 56 described with reference to FIGS. 8 and 9).

Such can lead to various of the advantages described previously in this disclosure. Among the advantages for eliminating bus lines is that such can eliminate slot burr, and can ease design while saving space and thus allowing a smaller footprint. Additionally, the removal of bus lines from designs of the present products can allow open/short tests to be achieved with the products, and can improve electrical performance at high frequencies due to elimination of an antenna effect caused by bus lines. Wirebondability of bond pads produced in accordance with methodology of the present invention should be similar regardless of whether electrolytic plating or electroless plating is used. Methodology of the present invention can achieve good plating thickness in relatively short plating time, utilizing electrolytic processes. Etching processes of the present invention can be conducted, in particular aspects, without tail traces left on the pattern.

FIG. 47 illustrates an exemplary processor system that may include semiconductor components produced using packaging methodology of the present invention, such as, for example, FCIP-BOC, BOC and/or COB packaging. Specifically, a processor system 500 is illustrated which can be, for example, a computer system. The processor system generally comprises a central processing unit (CPU) 502, for example, a microprocessor, that communicates with one or more input/output (I/O) devices 512, 514, and 516 over a system bus 522. System 500 also includes random access memory (RAM) 518, a read-only memory (ROM) 520 and may also include peripheral devices such as a floppy disk drive 504, a hard drive 506, a display 508 and a compact disk (CD) ROM drive 510 which also communicate with the processor 502 over the bus 522. Any or all of the elements of the processor system 500, for example, processor 502, RAM 518, ROM 520 or controller or other IC chips contained within the components shown in FIG. 47 may include semiconductor packages formed using methodology described with reference to FIGS. 10–46. It should be noted that FIG. 47 is representative of many different types of architectures of a processor system 500 which may employ the invention. It may also be desirable to integrate the CPU 502 and the RAM 518 on a single chip.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of forming circuit traces and contact pads for an interposer utilized in a semiconductor package, comprising:
    providing an interposer substrate having a pair of opposing surfaces; the opposing surfaces being a first surface and a second surface; the substrate having a conductive layer over the first surface;
    forming pads over the conductive layer by plating a conductive material over the conductive layer while using the conductive layer as an electrical connection to a power source; and
    after the plating, patterning the conductive layer into electrical traces.

2. The method of claim 1 wherein the conductive layer extends across an entirety of the first surface.

3. The method of claim 1 wherein the forming the pads comprises plating a nickel containing layer over the conductive layer and plating a gold-containing layer physically against the nickel-containing layer.

4. The method of claim 1 wherein the conductive layer predominately comprises copper, and has a thickness of at least about 10 microns.

5. The method of claim 1 wherein the conductive layer predominately comprises copper, and has a thickness of less than or equal to about 5 microns.

6. The method of claim 1 wherein the conductive layer predominately comprises copper, and has a thickness of less than or equal to about 5 microns; the method further comprising, prior to forming the pads, forming a patterned conductive material over the conductive layer; the patterned conductive material defining a pattern of the electrical traces; and wherein the patterned conductive material is utilized as a mask during the patterning of the conductive layer into the electrical traces.

7. The method of claim 6 wherein the patterned conductive material predominately comprises copper, and has a thickness of at least about 10 microns.

8. The method of claim 1 wherein no bus lines are utilized in addition to the conductive layer during the plating.

9. The method of claim 1 wherein the conductive layer comprises copper.

10. The method of claim 1 wherein the conductive layer is a first conductive layer, and further comprising a second conductive layer extending over the second surface; and wherein the pads are formed over the first and second conductive layers during the plating.

11. A method of forming circuit traces and contact pads for an interposer utilized in a semiconductor package, comprising:
    providing an interposer substrate having a surface and a conductive layer extending over the surface, the substrate having a central region where an opening will ultimately be formed to extend entirely through the substrate, and having a peripheral region extending around the central region;
    forming contact pads over the conductive layer within the peripheral region by plating a conductive material over the conductive layer while using the conductive layer as an electrical connection to a power source and without utilizing conductive busses, other than the conductive layer, extending over any portion of the central region of the substrate; and
    after the plating, forming the opening within the central region of the substrate and extending entirely through the substrate.

12. The method of claim 11 wherein the conductive layer extends across an entirety of the surface.

13. The method of claim 11 wherein the conductive layer has a thickness of less than about 5 microns during the plating of the conductive material.

14. The method of claim 11 wherein the conductive layer is a first conductive layer; the method further comprising forming a second conductive layer over the first conductive layer prior to the plating of the conductive material; wherein the second conductive layer is in a pattern of circuit traces; and wherein the contact pads are formed physically against the second conductive layer.

15. The method of claim 14 further comprising transferring the pattern of the second conductive layer to the first conductive layer after the plating of the conductive material.

16. The method of claim 11 wherein the conductive layer has a thickness of greater than about 10 microns during the plating of the conductive material.

17. The method of claim 11 wherein the semiconductor package is a board-on-chip construction.

18. A method of forming circuit traces and contact pads for an interposer utilized in a semiconductor package, comprising:
providing an interposer substrate having a pair of opposing surfaces; the opposing surfaces being a first surface and a second surface; the substrate having a first conductive layer over the first surface;
forming a second conductive layer over and in physical contact with at least portions of the first conductive layer;
forming a patterned mask to cover portions of the second conductive layer while leaving other portions exposed through openings in the mask;
plating a third conductive layer over the exposed portions of the second conductive layer while using the first conductive layer as an electrical connection between the exposed portions and a power source; and
after the plating, patterning the first conductive layer into electrical traces.

19. The method of claim 18 wherein the first conductive layer comprises copper.

20. The method of claim 18 wherein the first and second conductive layers comprise copper.

21. The method of claim 18 wherein the third conductive layer comprises one or more of nickel, gold and palladium.

22. The method of claim 18 wherein the semiconductor package is a board-on-chip construction.

23. A method of forming circuit traces and contact pads for an interposer utilized in a semiconductor package, comprising:
providing an interposer substrate having a pair of opposing surfaces; the opposing surfaces being a first surface and a second surface; the substrate having a first conductive layer over the first surface;
forming a first patterned mask over the first conductive layer; the first patterned mask having openings extending therethrough to the first conductive layer; the openings defining a circuit pattern;
forming a second conductive layer over and in physical contact with portions of the first conductive layer exposed through the openings; the second conductive layer thereby being formed in the circuit pattern;
forming a second patterned mask to cover portions of the second conductive layer while leaving other portions exposed through openings in the second patterned mask; the exposed portions of the second conductive layer being contact pad locations;
plating a third conductive layer over the contact pad locations while using the first conductive layer as an electrical connection to a power source;
removing the first and second patterned masks; and
patterning the first conductive layer into electrical traces defined by the circuit pattern of the second conductive layer.

24. The method of claim 23 wherein the first conductive layer predominately comprises copper, and has a thickness of less than or equal to about 5 microns.

25. The method of claim 23 wherein the first conductive layer predominately comprises copper and initially has a first thickness greater than about 10 microns, the method further comprising reducing a thickness of the first conductive layer to less than or equal to about 5 microns prior to forming the second conductive layer.

26. The method of claim 23 wherein the second conductive layer and first conductive layer predominately comprise copper, and wherein a combined thickness of the first and second conductive layers is greater than about 10 microns.

27. The method of claim 23 wherein the third conductive layer comprises nickel, and further comprising forming a layer comprising gold over the third conductive layer prior to removing the first and second patterned masks.

28. The method of claim 23 further comprising forming an opening extending entirely through the substrate after plating the third conductive layer.

29. The method of claim 23 wherein the semiconductor package is a board-on-chip construction.

30. The method of claim 29 wherein:
a fourth conductive layer is over the second surface;
a third patterned mask is formed over the fourth conductive layer, and the third patterned mask has openings extending therethrough to the fourth conductive layer;
the second conductive layer is formed within the openings in the third patterned mask during the forming of the second conductive layer over and in physical contact with the first conductive layer;
after the second conductive layer is formed, a fourth patterned mask is formed over the fourth conductive layer to protect regions of the fourth conductive layer which are to be formed into circuit traces while leaving other portions of the fourth conductive layer exposed; and
the fourth conductive layer is patterned into circuit traces during the patterning of the first conductive layer into circuit traces.

31. A method of forming circuit traces and contact pads for an interposer utilized in a semiconductor package, comprising:
providing an interposer substrate having a pair of opposing surfaces; the opposing surfaces being a first surface and a second surface; the substrate having a first conductive layer over the first surface;
forming a first patterned mask over the first conductive layer; the first patterned mask having openings extending therethrough to the first conductive layer; the openings defining contact pad locations;
forming a second conductive layer over and in physical contact with portions of the first conductive layer exposed through the openings; the second conductive layer thereby being formed at the contact pad locations;
removing the first patterned mask;
forming a second patterned mask over the first conductive layer; the second patterned mask protecting regions of the first conductive layer while exposing other regions; the protected regions defining circuit traces to at least some of the contact pad locations;
removing unprotected regions of the first conductive layer to form the circuit traces from the first conductive layer; and
removing the second patterned mask.

32. The method of claim 31 wherein the semiconductor package is a board-on-chip construction.

33. A method of forming circuit traces and contact pads for an interposer utilized in a semiconductor package, comprising:
providing an interposer substrate having a pair of opposing surfaces; the opposing surfaces being a first surface and a second surface; the substrate having a first conductive layer over the first surface and a second conductive layer over the second surface;

forming a first patterned mask over the first and second conductive layers; the first patterned mask having openings extending therethrough to the first and second conductive layers; the openings defining contact pad locations;

forming a third conductive layer over and in physical contact with portions of the first and second conductive layers exposed through the openings; the third conductive layer thereby being formed at the contact pad locations;

removing the first patterned mask;

forming a second patterned mask over the first and second conductive layers; the second patterned mask protecting regions of the first and second conductive layers while exposing other regions; the protected regions defining circuit traces to at least some of the contact pad locations;

removing unprotected regions of the first and second conductive layers to form the circuit traces from the first and second conductive layers; and removing the second patterned mask.

34. The method of claim 33 wherein the first and second conductive layers predominately comprise copper, and have thicknesses of greater than or equal to about 10 microns.

35. The method of claim 33 wherein the third conductive layer is formed by plating while using the first and second conductive layers as electrical interconnects to a power source.

36. The method of claim 33 wherein the third conductive layer comprises nickel, and further comprising forming a layer comprising gold nickel over the third conductive layer in the contact pad locations.

37. The method of claim 33 further comprising forming an opening extending entirely through the substrate after forming the circuit traces from the first and second conductive layers.

38. The method of claim 33 further comprising forming an opening extending entirely through the substrate and subsequently providing a conductive material within the opening to electrically connect the first and second conductive layers.

39. The method of claim 38 wherein the opening is formed before forming the first patterned mask.

* * * * *

UNITED STATES PATENT AND TRADEMARK OFFICE
CERTIFICATE OF CORRECTION

PATENT NO. : 6,913,952 B2 Page 1 of 1
APPLICATION NO. : 10/612837
DATED : July 5, 2005
INVENTOR(S) : Stephen F. Moxham et al.

It is certified that error appears in the above-identified patent and that said Letters Patent is hereby corrected as shown below:

Col. 7, line 29 -
  Please replace "The openings 1 10 extending through mask 106 can be"
  With --The openings 110 extending through mask 106 can be--

Signed and Sealed this

Fifth Day of December, 2006

JON W. DUDAS
*Director of the United States Patent and Trademark Office*